(12) United States Patent
Nakamura

(10) Patent No.: US 7,903,484 B2
(45) Date of Patent: Mar. 8, 2011

(54) SEMICONDUCTOR MEMORY AND MANUFACTURING METHOD THEREOF

(75) Inventor: Toshikazu Nakamura, Kawasaki (JP)

(73) Assignee: Fujitsu Semiconductor Limited, Yokokama (JP)

( * ) Notice: Subject to any disclaimer, the term of this patent is extended or adjusted under 35 U.S.C. 154(b) by 214 days.

(21) Appl. No.: 12/361,697

(22) Filed: Jan. 29, 2009

(65) Prior Publication Data

US 2009/0190423 A1 Jul. 30, 2009

(30) Foreign Application Priority Data

Jan. 30, 2008 (JP) ............................. 2008-019600

(51) Int. Cl.
*G11C 7/00* (2006.01)
(52) U.S. Cl. .................. 365/200; 365/189.07; 365/201; 365/203
(58) Field of Classification Search .................. 365/200, 365/189.07, 201, 203
See application file for complete search history.

(56) References Cited

U.S. PATENT DOCUMENTS

| 5,148,398 | A | | 9/1992 | Kohno | |
| 5,153,880 | A | * | 10/1992 | Owen et al. | 714/710 |
| 5,907,515 | A | | 5/1999 | Hatakeyama | |
| 6,731,553 | B2 | | 5/2004 | Fujioka et al. | |
| 6,901,015 | B2 | * | 5/2005 | Shinohara | 365/200 |
| 7,248,514 | B2 | * | 7/2007 | Nishihara et al. | 365/200 |
| 2004/0017703 | A1 | * | 1/2004 | Shinohara | 365/200 |

FOREIGN PATENT DOCUMENTS

| JP | 3-37900 A | 2/1991 |
| JP | 11-176188 A | 7/1999 |
| JP | 2003-168299 A | 6/2003 |

* cited by examiner

*Primary Examiner* — Son Dinh
(74) *Attorney, Agent, or Firm* — Fujitsu Patent Center

(57) ABSTRACT

A semiconductor memory is provided which performs redundancy on a memory cell by a given bit unit, the semiconductor memory includes: a comparator circuit that compares an input address and a redundancy address; a judgment circuit that judges whether to perform the redundancy based on a compared result, wherein the judgment circuit outputs a plurality of redundancy judgment signals that indicates whether to perform redundancy for each portion obtained by dividing the given bit unit by n which is an integer equal to or greater than two.

20 Claims, 19 Drawing Sheets

SEMICONDUCTOR MEMORY AND MANUFACTURING METHOD THEREOF

CROSS-REFERENCE TO RELATED APPLICATIONS

This application claims the benefit of priority from Japanese Patent Application No. 2008-19600 filed on Jan. 30, 2008, the entire contents of which are incorporated herein by reference.

BACKGROUND

1. Field

The present application relates to a semiconductor memory cell including a redundancy memory cell which relieves defects.

2. Description of Related Art

Test time of the semiconductor memory tends to increase with an increase in memory capacity. Japanese Laid-open Patent Publication No. 3-37900, Japanese Laid-open Patent Publication No. 2003-168299 and Japanese Laid-open Patent Publication No. 11-176188 disclose techniques for reducing the test time of the semiconductor memory. To reduce the test time, the above patent documents disclose compression test methods in which one write data signal is written in a plurality of memory cells with different addresses.

SUMMARY

According to one aspect of an embodiment, a semiconductor memory which performs redundancy on a memory cell by a given bit unit, includes a comparator circuit that compares an input address and a redundancy address; a judgment circuit that judges whether to perform the redundancy based on a compared result, wherein the judgment circuit outputs a plurality of redundancy judgment signals that indicates whether to perform redundancy for each portion obtained by dividing the given bit unit by n which is an integer equal to or greater than two.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 1:
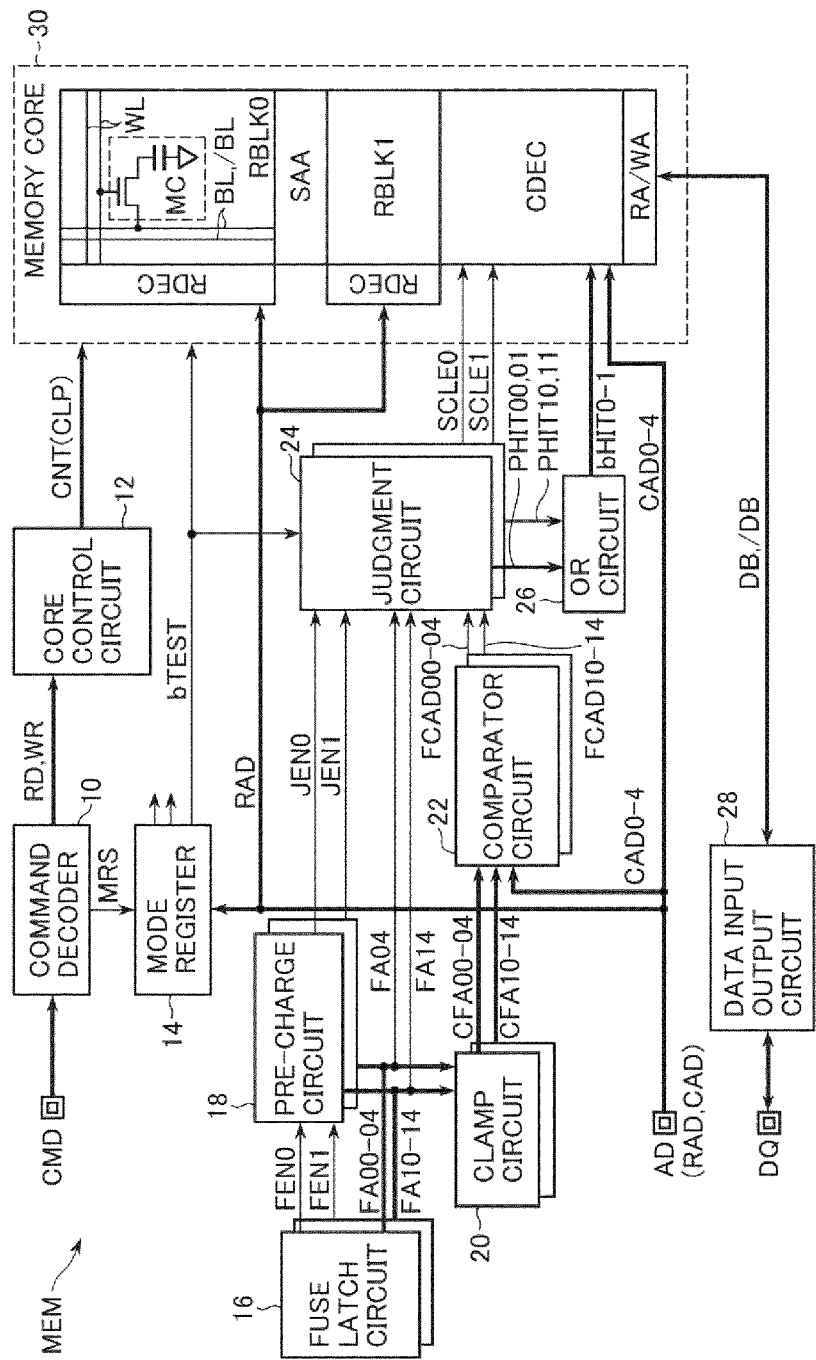
FIG. 1 illustrates a first embodiment.

In FIG. 1, a signal line represented as a "bold line" includes a plurality of lines. A part of a building block to which the bold line is connected includes a plurality of circuits. Signals supplied through the signal lines are attached with the same reference numerals or reference symbols as that of the signal lines. A "b" or a slash "/" prefixed to a signal name signifies a negative logic. A double square in FIG. 1 indicates an external terminal. For example, the external terminal may be a pad on a semiconductor chip or a lead of a package enclosing a semiconductor chip therein. Signals supplied through the external terminals are attached with the same reference numerals or reference symbols as the external terminals.

FIG. 1 illustrates a first embodiment. For example, a semiconductor memory MEM may be a fast cycle random access memory (FCRAM) of a pseudo SRAM type. The Pseudo-SRAM includes a memory cell of a DRAM (a dynamic memory cell) and an interface of an SRAM. The memory MEM may be a semiconductor memory device enclosed in the package. The memory MEM may be a memory macro (IP) mounted on a system LSI or the like. The memory MEM may be a clock synchronous type or a clock asynchronous type.

The memory MEM includes a command decoder 10, a core control circuit 12, a mode register 14, a fuse latch circuit 16, a pre-charge circuit 18, a clamp circuit 20, a comparator circuit 22, a judgment circuit 24, an OR circuit 26, a data input output circuit 28 and a memory core 30. Two fuse latch circuits 16, two pre-charge circuits 18, two clamp circuits 20, two comparator circuits 22, and two judgment circuits 24 are provided respectively corresponding to a redundancy column selection line SCSL0 and a redundancy column selection line SCSL1 illustrated in FIG. 2. However, more than three of the above circuits may be provided.

Although it is not shown in FIG. 1, the memory MEM in FIG. 1 includes a refresh timer which periodically generates an internal refresh request to automatically execute a refresh operation, a refresh address counter which generates a refresh address signal for indicating a memory cell to be refreshed, and an address selector which supplies a row decoder RDEC with any of an external address signal AD (RAD) or the refresh address signal. The core control circuit 12 may include an arbiter which specifies the priority order of an external access command (a read command and a write command) and the internal refresh request.

The command decoder 10 in FIG. 1 outputs a read command signal RD or a write command signal WR to execute an access operation (a read operation or a write operation) of the memory core 30 in response to a command signal CMD.

The command decoder 10 outputs a mode register setting command signal MRS for setting the mode register 14. The mode register setting command signal MRS is output when the command decoder 10 receives the command signal CMD having combinations that are not used in a normal access operation. The command signal CMD includes a chip enable signal, a write enable signal, an output enable signal or the like. The command decoder 10 may receive the command signal CMD via an input buffer.

The core control circuit 12 in FIG. 1 outputs a control signal CNT that controls the access operation (the read operation and the write operation) of the memory core 30 or the refresh operation, in response to the read command signal RD, the write command signal WR, or a refresh command signal (not shown in FIG. 1). The control signal CNT includes a column pulse signal CLP which determines a timing to turn column switches CSW on, a timing signal to pre-charge bit lines BL and/BL, a timing signal to activate word lines WL, or and a timing signal to activate sense amplifiers SA, illustrated in FIG. 3. Note that the column pulse signal CLP is not output when the refresh operation is executed.

The mode register 14 includes a plurality of registers which are set, for example, by receiving a row address signal RAD in synchronization with the mode register setting command signal MRS. The mode register 14 may set the signals for the plurality of registers by receiving a column address signal CAD or a data signal DQ. The address signal AD (the row address signal RAD and the column address signal CAD) may be supplied to the memory MEM via the input buffer.

The mode register 14 outputs a mode signal in response to the signal that is set to each of the registers. At least one of the core control circuit 12, the data input output circuit 28 and the memory core 30 operates with the operation mode corresponding to the mode signal. For example, when the memory MEM is the clock synchronous type, a read latency or a burst length is set to the mode register 14. The read latency indicates the number of clocks counted during a period of time after receiving the read command until starting the output of the read data. The burst length is the number of output times of the data signal that is output from a data terminal DQ in response to the single read command, and the number of input times of the data signal that is received at the data terminal DQ in response to the single write command.

Note that the mode register 14 may also be referred to as a configuration register.

The mode register 14 includes a test register used for testing the memory MEM. On receiving the row address signal RAD indicating a compression test mode, the mode register 14 sets up the corresponding test register and activates a test mode signal bTEST to a low level so as to cause the memory MEM to enter the compression test mode. When the memory MEM exits the test mode, the test register is reset based on an exit command or power reactivation. The mode register 14 may include a test register to forcibly prohibit use of a redundancy memory cell or a test register to forcibly use the redundancy memory cell.

Figure 4:
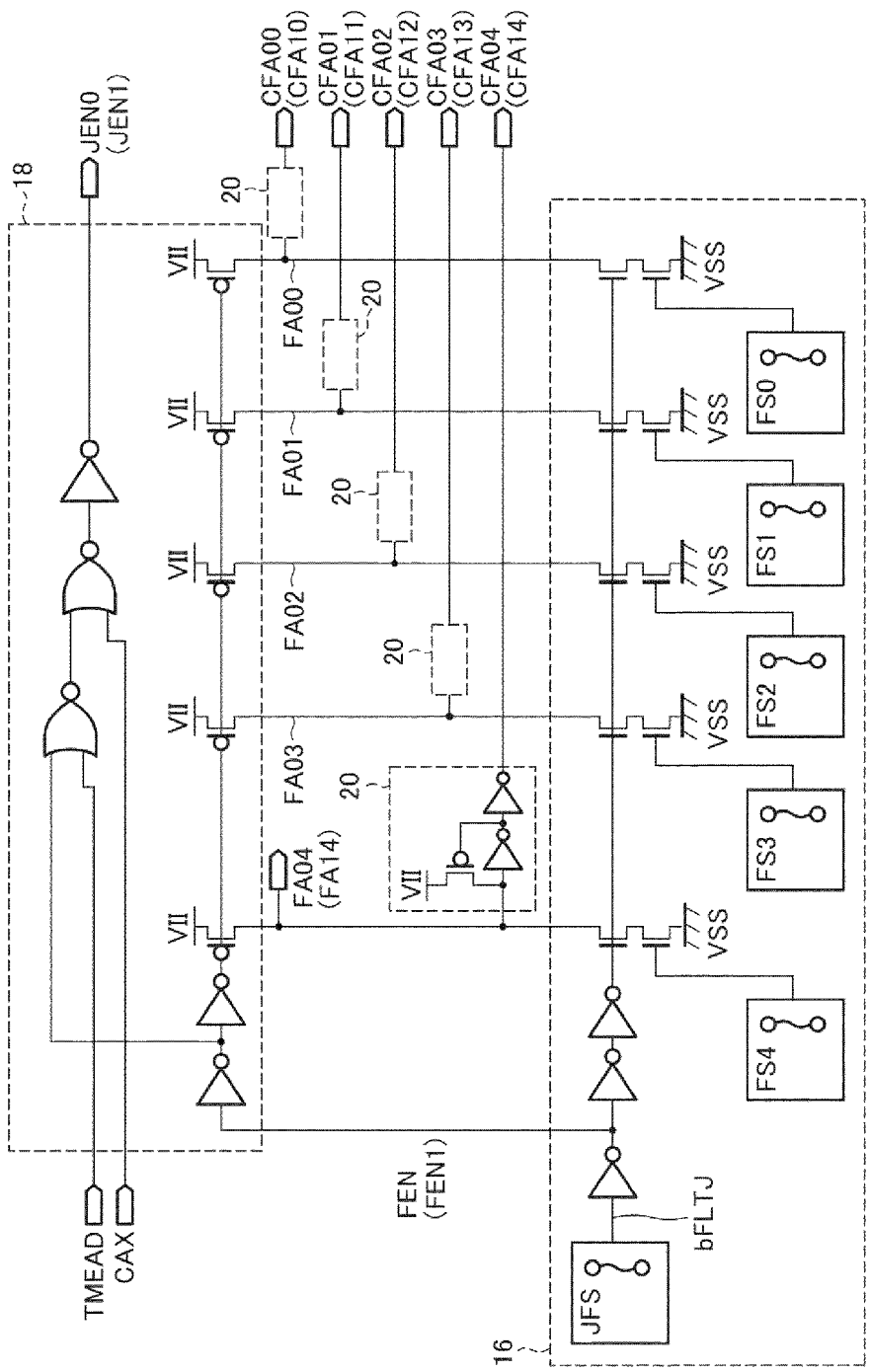
FIG. 4 illustrates a fuse latch circuit, a pre-charge circuit, and a clamp circuit according to the first embodiment.

The fuse latch circuit 16 in FIG. 1 stores a defective address (a column address) that indicates a defective memory cell MC, defective bit lines BL and/BL, a defective sense amplifier SA, or the like and outputs fuse address signals FA00 to FA04 (or FA10 to FA14) of five (5) bits. When the fuse latch circuit 16 stores the defective address, the fuse latch circuit 16 outputs a fuse enable signal FEN0 (or FEN1) having a high level. FIG. 4 illustrates the fuse latch circuit 16.

When the fuse latch circuit 16 is not used, the pre-charge circuit 18 in FIG. 1 pre-charges the fuse address signal lines FA00 to FA04 (or FA10 to FA14) to a high level. The pre-charge circuit 18 receives the fuse enable signal FEN0 (or FEN1) and outputs a judgment enable signal JEN0 (or JEN1). FIG. 4 illustrates the pre-charge circuit 18.

The clamp circuit 20 in FIG. 1 clamps the logic level of the fuse address signals FA00 to FA04 (or FA10 to FA14) and outputs the fuse address signals CFA00 to CFA04 (or CFA10 to CFA14). When the fuse latch circuit 16 is not used, the clamp circuit 20 prevents the fuse address signal lines FA00 to FA04 (FA10 to FA14) from being placed in a floating state. FIG. 4 illustrates the clamp circuit 20.

Figure 5:
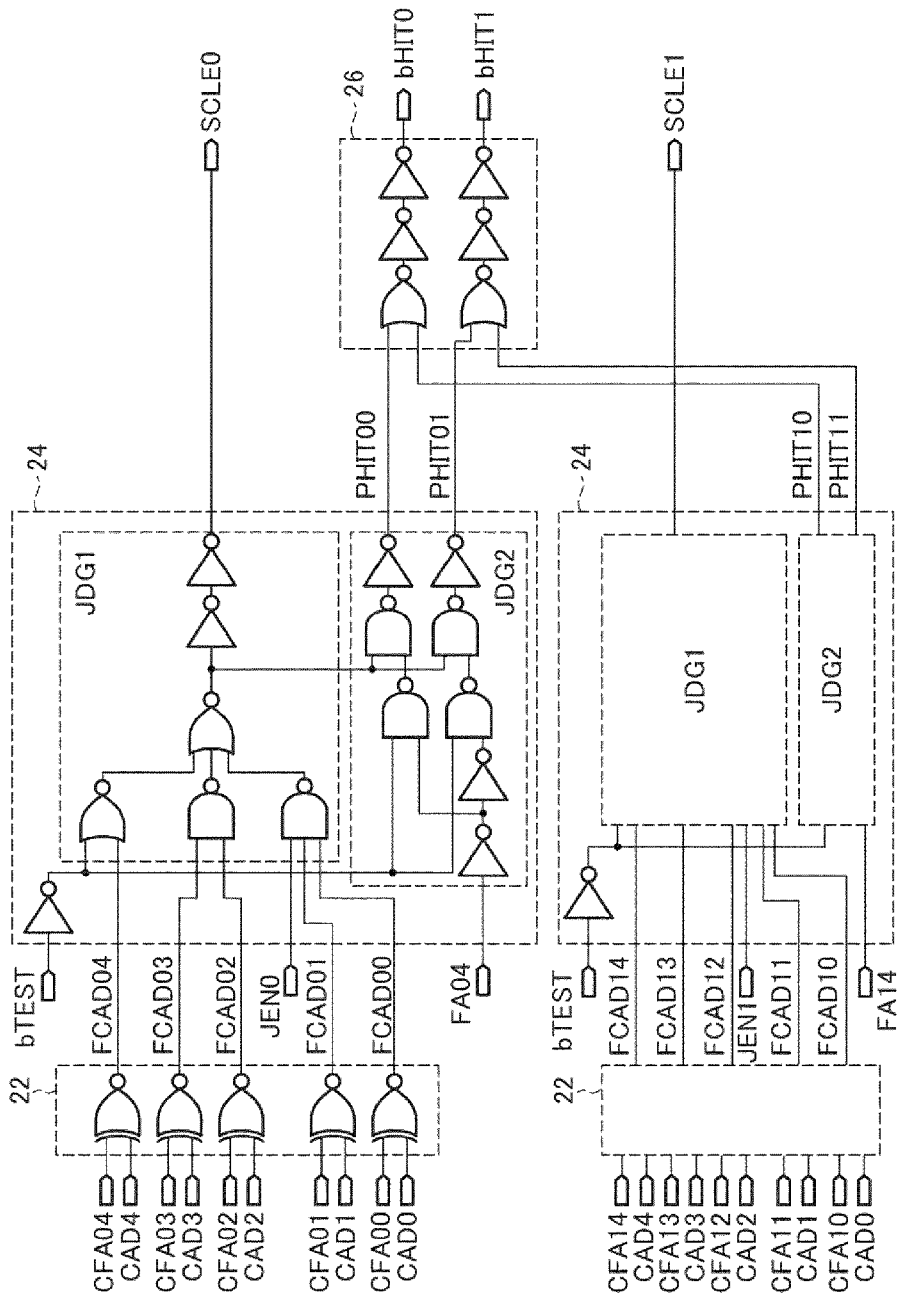
FIG. 5 illustrates a comparator circuit, a judgment circuit, and an OR circuit according to the first embodiment.

The comparator circuit 22 in FIG. 1 compares an input address AD (CAD0 to CAD4), which is supplied along with the external address commands RD and WR, with a defective address (the fuse address signals CFA00 to CFA04 or CFA10 to CFA14) bit by bit. When bit values are coincident with each other, the comparator circuit 22 changes bits of corresponding coincidence address signals FCAD00 to FCAD04 or FCAD10 to FCAD14 to a high level. FIG. 5 illustrates a comparator circuit 22.

Figure 2:
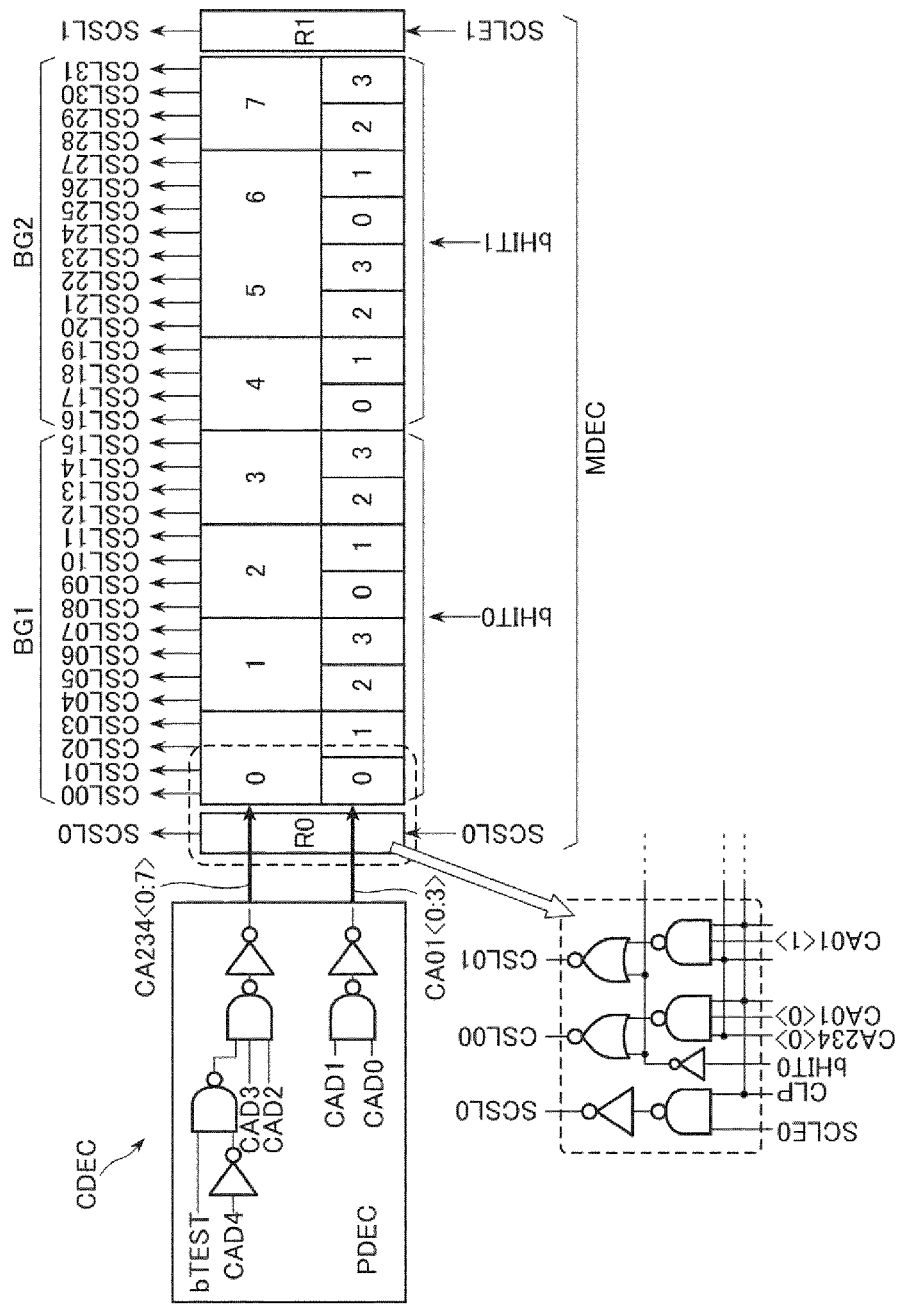
FIG. 2 illustrates a column decoder according to the first embodiment.

The judgment circuit 24 in FIG. 1 determines whether to use the redundancy memory cell RMC (in FIG. 3) or not, based on the coincidence address signals FCAD00 to FCAD004 or FCAD10 to FCAD14 obtained as comparison results from the comparator circuit 22. The judgment circuit 24 outputs hit signals PHIT00, PHIT01, PHIT10 and PHIT11 (redundancy judgment signals) which correspond to each of the plurality of bit groups made up of given bit units and indicate whether to relieve or not. As illustrated in FIG. 2, the memory MEM in a first embodiment includes two bit groups, that is, a bit group BG1 and a bit group BG2. A defect in a real memory cell MC is relieved by replacing a pair of bit lines BL and/BL with a pair of redundancy bit lines RBL and/RBL, for each bit group (BG1 and BG2).

Figure 3:
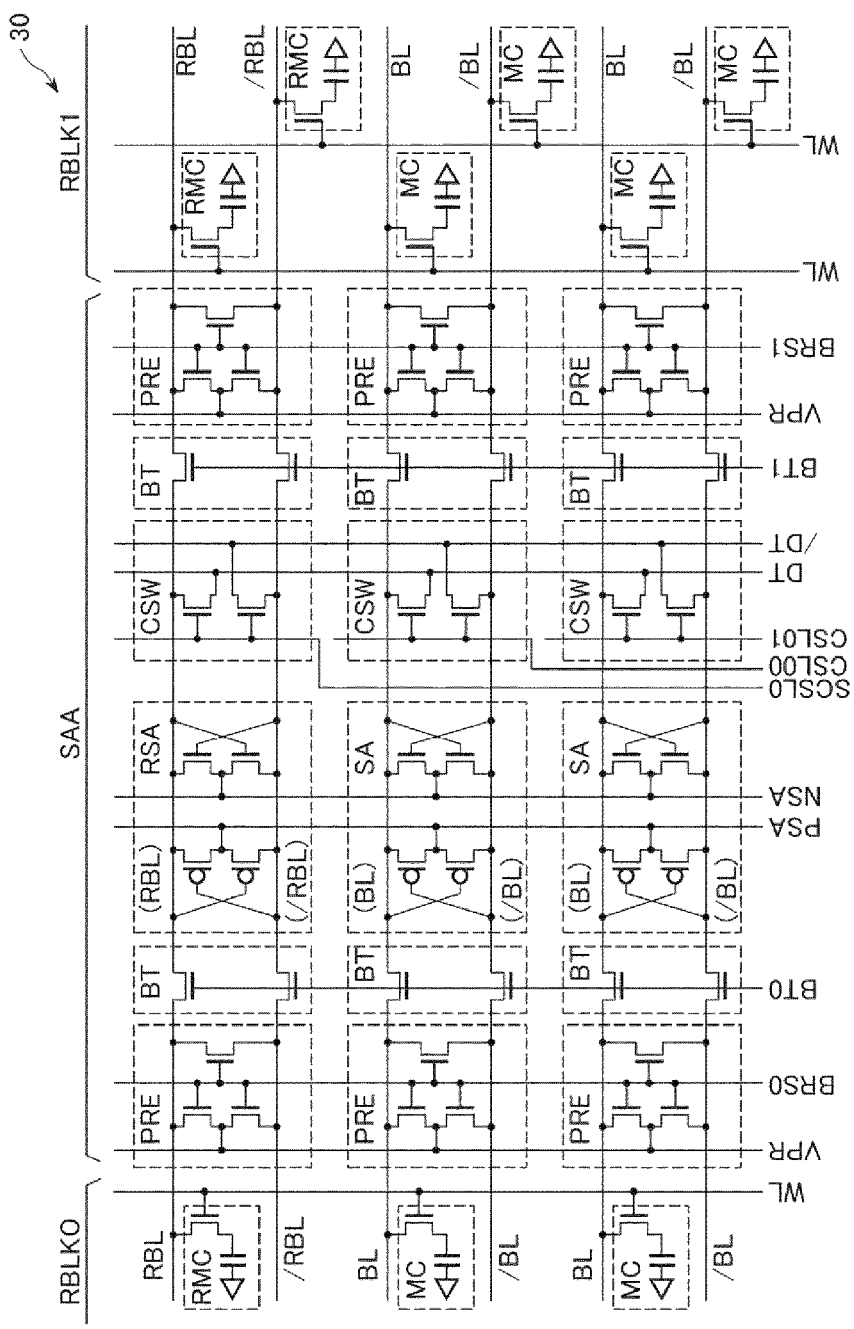
FIG. 3 illustrates a sense amplifier according to the first embodiment.

When the judgment enable signal JEN0 (or JEN1) is at a high level (when relieving a defective memory cell by using the redundancy memory cell RMC illustrated in FIG. 3), a redundancy column enable signal SCLE0 (or SCLE1) is changed to a high level in response to the bit values of the coincidence address signals FCAD00 to FCAD04 (or FCAD10 to FCAD14), and at least one of the hit signals PHIT00, PHIT01, PHIT10 and PHIT11 (the redundancy judgment signals) is changed to a high level.

Figure 8:
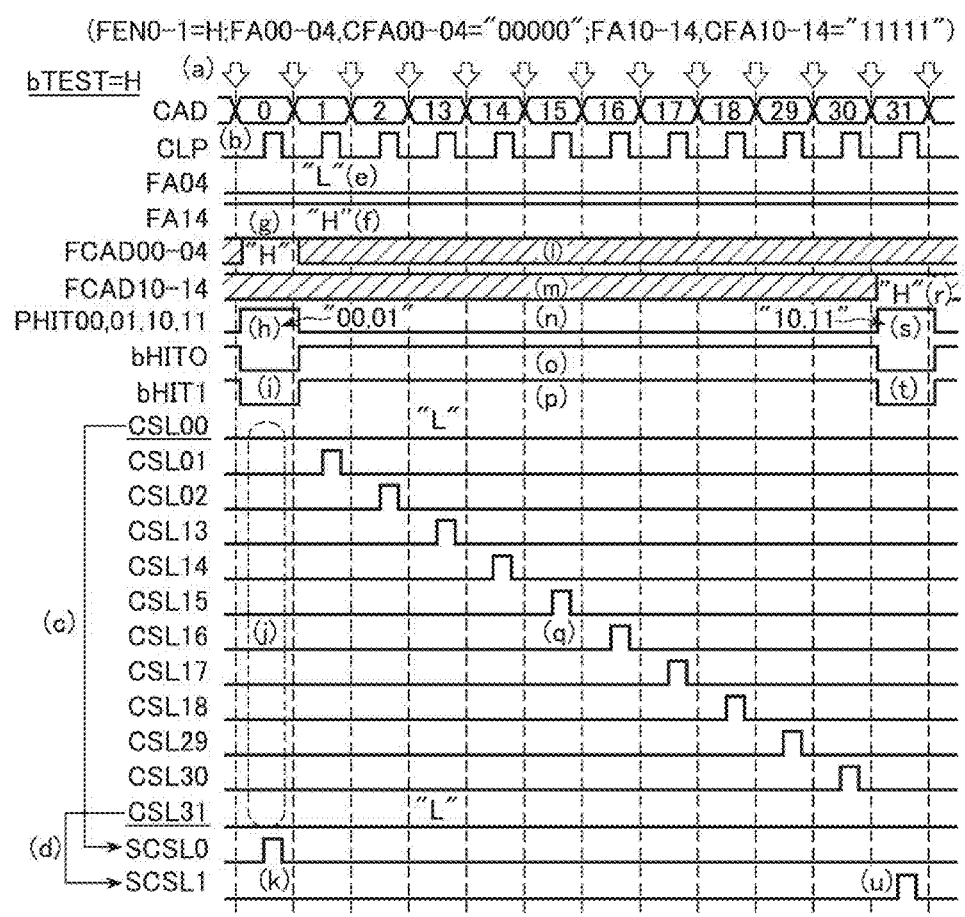
FIG. 8 illustrates operations, in the normal operation mode, of a memory according to the first embodiment.
Figure 9:
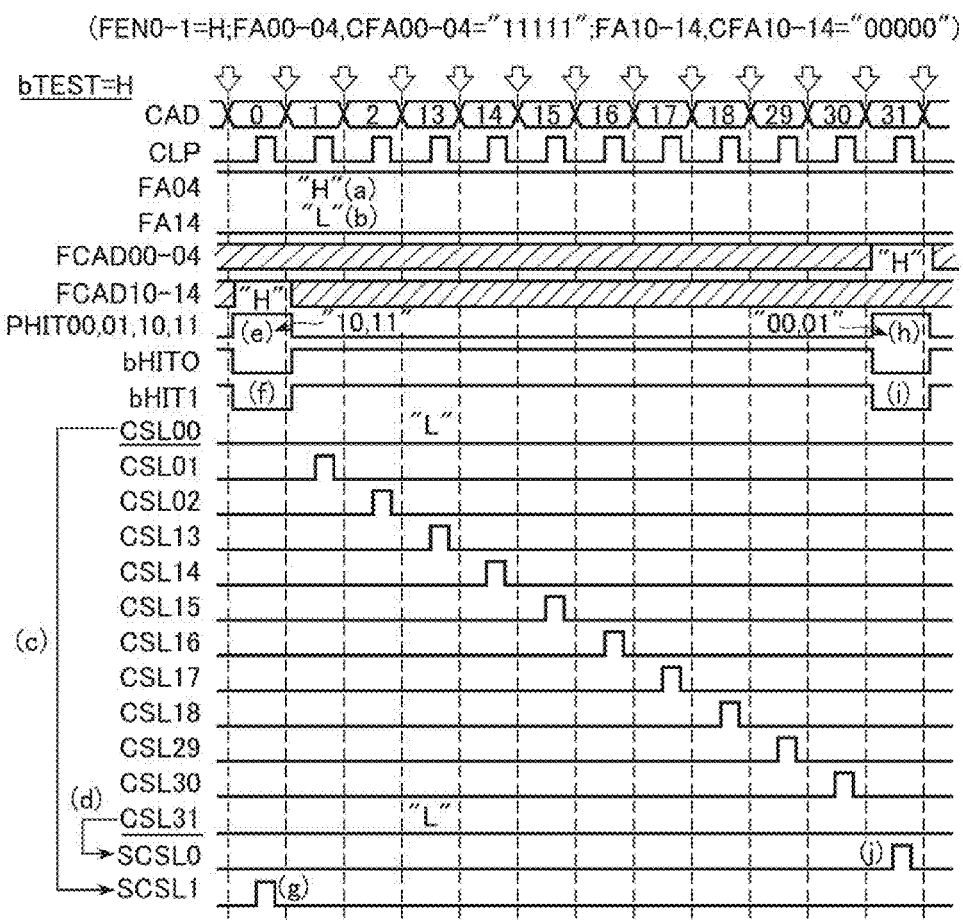
FIG. 9 illustrates other operations, in the normal operation mode, of the memory according to the first embodiment.
Figure 10:
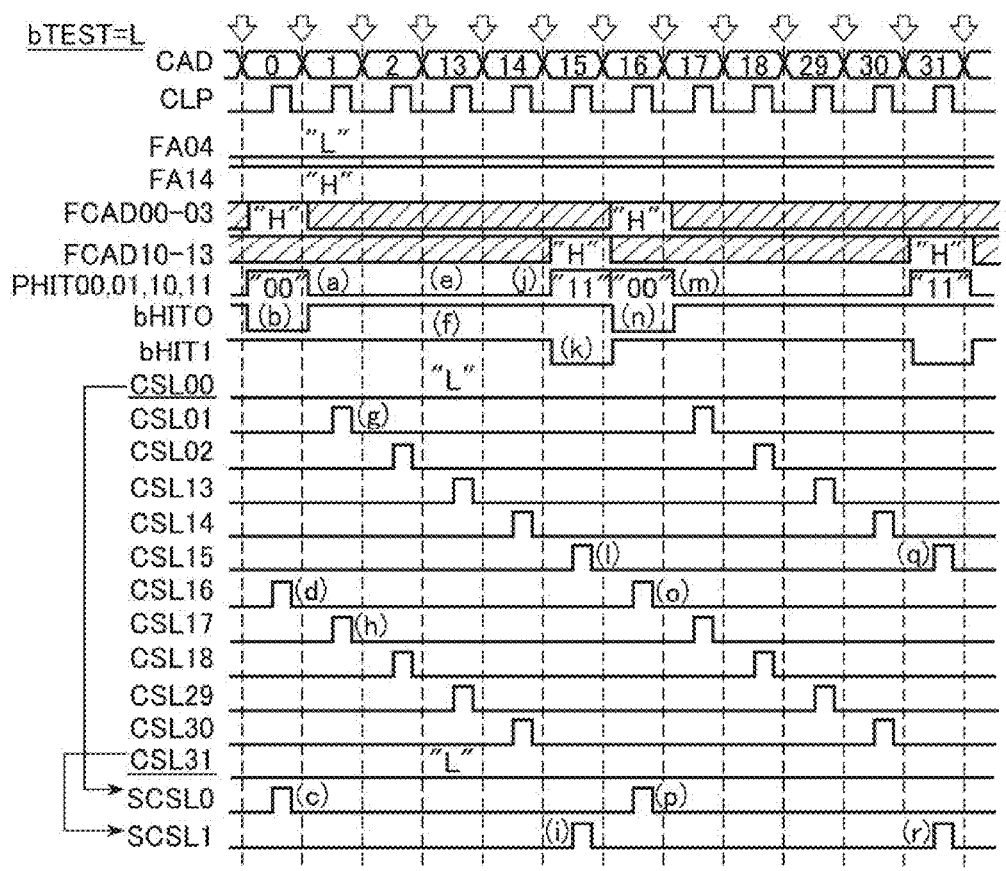
FIG. 10 illustrates operations, in the compression test mode, of the memory according to the first embodiment.
Figure 11:
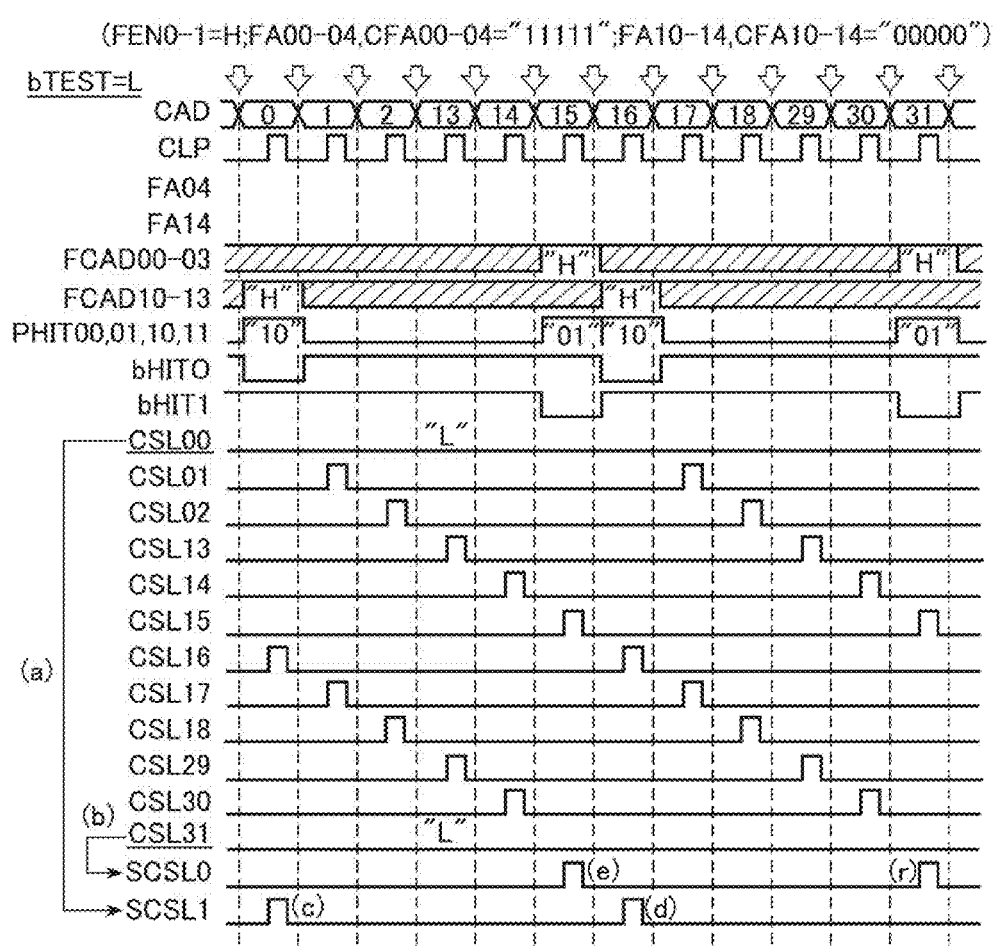
FIG. 11 illustrates other operations, in the compression test mode, of the memory according to the first embodiment.

In the normal operation mode where the test mode signal bTEST is set to a high level, as illustrated in FIGS. 8 and 9, the pair of hit signals PHIT00 and PHIT01 (or PHIT10 and PHIT11) contemporaneously changes to the high level. In the test mode where the test mode signal bTEST is set at a low level, as illustrated in FIGS. 10 and 11, one of the hit signals PHIT00 and PHIT01 (or one of the hit signals PHIT10 and PHIT11) changes to the high level in response to the fuse address signal FA04 (or FA14). The judgment circuit 24 outputs at least one of the hit signals PHIT00 and PHIT01 and at least one of the hit signals PHIT10 and PHIT11, based on the test mode signal bTEST. FIG. 5 illustrates the judgment circuit 24.

The OR circuit 26 in FIG. 1 inverts an OR logic of the hit signals PHIT00 and PHIT01 and outputs a hit signal bHIT0.

The OR circuit 26 inverts an OR logic of the hit signals PHIT10 and PHIT11 and outputs a hit signal bHIT1. FIG. 5 illustrates the OR circuit 26.

The data input output circuit 28 in FIG. 1 receives the read data read out from the memory cell MC via complementary data bus lines DB and/DB in a read operation and outputs the received read data to the data terminal DQ (e.g., sixteen (16) bits). The data input output circuit 28 receives a write data signal supplied to the data terminal DQ in a write operation and outputs the received data signal to the data bus lines DB and/DB. Note that the data terminal DQ may be one (1) bit.

The memory core 30 in FIG. 1 includes a pair of row blocks RBLK0 and RBLK1, row decoders RDEC corresponding to the respective row blocks RBLK0 and RBLK1, a sense amplifier area SM provided between the row block RBLK0 and the row block RBLK1, a column decoder CDEC, a read amplifier RA and a write amplifier WA. The number of row blocks RBLK may be four (4), eight (8), or sixteen (16), or the like. Each of the row blocks RBLK0 and RBLK1 includes a plurality of memory cells MC arranged in a matrix manner, a plurality of word lines WL coupled to rows of the memory cells MC arranged in a horizontal direction in FIG. 3, and a plurality of pair of bit lines BL and/BL coupled to columns of the memory cells MC arranged in a vertical direction in FIG. 3. Each memory cell MC includes a capacitor for storing data as an electric charge and a transfer transistor for coupling one end of the capacitor to the bit line BL (or/BL). Another end of the capacitor is coupled to a reference voltage supply line.

In order to select the pair of bit lines BL and/BL which corresponds to the number of bits of the data terminal DQ, the column decoder CDEC in FIG. 1 activates any of the column selection lines s CSL00 to CSL31 (in FIG. 2) to a high level, in response to the column address signals CAD0 to CAD4. When receiving the redundancy column enable signal SCLE0 having the high level and the hit signal bHIT0 having a low level, the column decoder CDEC does not activate the column selection lines CSL00 to CSL15 but activates the redundancy column selection line SCSL0. When receiving the redundancy column enable signal SCLE1 having the high level and the hit signal bHIT1 having the low level, the column decoder CDEC does not activate the column selection lines CSL16 to CSL31 but activates the redundancy column selection line SCSL1. FIG. 2 illustrates the column decoder CDEC.

The read amplifier RA illustrated in FIG. 1 amplifies complementary read data that is output via the column switch CSW (FIG. 3) in the read operation. The write amplifier WA amplifies complementary write data supplied via the data bus lines DB and/DB, in the write operation, to supply the amplified complementary write data to the pair of bit lines BL and/BL.

FIG. 2 illustrates the column decoder CDEC in FIG. 1. The column decoder CDEC includes a pre-decoder PDEC and a main decoder MDEC. The pre-decoder PDEC includes a logic circuit which decodes the column address signals CAD0 and CAD1 and activates any of the four (4) column decode signals CA01 <0:3> to a high level. The pre-decoder PDEC includes a logic circuit which decodes the column address signals CAD2 to CAD4 and activates at least one of the eight (8) column decode signals CA234 [<0:7> to a high level. In the compression test mode (when the bTEST is at the low level), the pre-decoder PDEC generates the column decode signals CA234 <0:7> only by using the column address signals CAD2 and CAD3 regardless of a value of the column address signal CAD4. For the above reason, in the compression test mode, two column decode signals CA234 <0:7> are contemporaneously activated to the high level and two column selection lines CSL (e.g., CSL00 and CSL16) are contemporaneously selected. The pre-decoder PDEC may be provided outside the memory core 30.

The main decoder MDEC includes a logic circuit which activates the column selection lines CSL00 to CSL31 to the high level in response to the column decode signals CA01 <0:3> and the column decode signals CA234 <0:7> when the hit signal bHIT0 (or the hit signal bHIT1) is at the high level. The main decoder MDEC includes logic circuits R0 and R1 which activate the redundancy column selection line SCSL0 or SCSL1 to a high level in response to the redundancy column enable signal SCLE0 or SCLE1. Column selection signals corresponding to the column selection lines CSL00 to CSL31 and redundancy column selection signals corresponding to the redundancy column selection lines SCSL0 and SCSL1 are generated in synchronization with the column pulse signal CLP.

The main decoder MDEC identifies the bit group BG1, which is selected based on the column address signal CAD4 having a low level, and the bit group BG2, which is selected based on the column address signal CAD4 having an high level. The bit group BG1 includes the bit lines BL and/BL corresponding to the column selection lines CSL0 to CSL15 and the real memory cell MC (in FIG. 3). The bit group BG2 includes the bit lines BL and/BL corresponding to the column selection lines CSL16 to CSL31 and the real memory cell MC. The number of the pair of bit lines BL and/BL selected based on respective column selection lines CSL0 to CSL31 in each bit groups BG1 and BG2 may be, for example, sixteen (16) pairs (the same number as that of the data terminals DQ) for each row block, that is, the row bock RBLK0 and the row block RBLK1. FIGS. 8 through 11 illustrate operations of the main decoder MDEC.

In the first embodiment, any of the thirty-two (32) column selection lines CSL00 to CSL31 is selected by using the column address signals CAD0 to CAD4 of five (5) bits. However, the number of bits of the column address signal CAD may be equal to or greater than six (6) bits and the number of the column selection line CSL may be equal to or greater than sixty-four (64) signals.

FIG. 3 illustrates details of the sense amplifier area SM according to the first embodiment. FIG. 3 illustrates a part of the sense amplifier area SM corresponding to, for example, one data terminal DQ. When the data terminal DQ is sixteen (16) bits, the memory MEM includes a part (in FIG. 3) of the sense amplifier area SM corresponding to each of the sixteen (16) data terminals DQ. The sense amplifier area SM includes a pre-charge circuit PRE and a coupling switch BT corresponding to each of the row blocks RBLK0 and RBLK1, and the sense amplifier SA and the column switch CSW shared with the row blocks RBLK0 and RBLK1.

The coupling switch BT selectively couples the pair of bit lines BL and /BL for the respective row blocks RBLK0 and RBLK1 to the sense amplifiers SA. The coupling switch BT also selectively couples the pair of redundancy bit lines RBL and/RBL for the respective row blocks RBLK0 and RBLK1 to a redundancy sense amplifier RSA. The pair of redundancy bit lines RBL and/RBL are coupled to the redundancy memory cells RMC and coupled to the data lines DT and/DT by means of the redundancy column selection signal corresponding to the redundancy column selection line SCSL0. Although it is not illustrated in FIG. 3, the memory core 30 includes the pair of redundancy bit lines RBL and/RBL and the redundancy memory cells RMC coupled to the data lines DT and/DT by the redundancy column selection signal corresponding to the redundancy column selection line SCSL1.

When real column selection signals corresponding to the column selection lines CSL00 to CSL31 or the redundancy column selection signals corresponding to the redundancy column selection lines SCSL0 and SCSL1 are at a high level, each of the column switches CSW switches on and couples the sense amplifier SA and the pair of bit lines BL and/BL to the data lines DT and/DT. For example, the data lines DT and/DT are interconnected to each pair of row blocks RBLK0 and RBLK1 and are coupled in common to each bit of the data terminal DQ. The sense amplifier area SM may have the same structure as a typical dynamic RAM (DRAM).

FIG. 4 illustrates the fuse latch circuit 16, the pre-charge circuit 18, and the clamp circuit 20. Hereinafter, the fuse latch circuit 16 corresponding to the redundancy column selection line SCSL0 in FIG. 2, the pre-charge circuit 18, and the clamp circuit 20 will be disclosed. FIG. 4 illustrates one of the pair of fuse latch circuits 16, which stores defective addresses FA00 to FA04, and a signal supplied from one of the pair of pre-charge circuits 18. The other of the pair of fuse latch circuits 16, which stores the defective addresses FA10 to FA14, and a signal supplied from the other of the pair of pre-charge circuits 18 are indicated within parentheses in FIG. 4.

The fuse latch circuit 16 includes five (5) fuse circuits FS0 to FS4 corresponding to respective bits CAD0 to CAD4 of the column address signal CAD, a judgment fuse circuit JFS, and five (5) pairs of nMOS transistors which receive output signals from the fuse circuits FS0 to FS4 and the judgment fuse circuit JFS with gates of the nMOS transistors. Fuses of the respective fuse circuits FS0 to FS4 are cut when the bits of the corresponding defective column address signals CAD0 to CAD4 are zero (0). For example, when the column addresses CAD0 to CAD4 indicating the defective memory cell MC are "00000", all the fuses FS0 to FS4 are cut (a programmed state), so that all the fuse circuits FS0 to FS4 output a high level. The fuse latch circuit 16 has a function that stores the defective addresses.

The fuse of the judgment fuse circuit JFS is cut when the defective column address signals CAD0 to CAD4 are programmed to the fuse circuits FS0 to FS4. The judgment fuse circuit JFS outputs a fuse judgment signal bFLTJ having a high level when the fuse is not cut, and the judgment fuse circuit JFS outputs the fuse judgment signal bFLTJ having a low level when the fuse is cut.

Each pair of the nMOS transistors outputs a fuse address signal FA (FA00 to FA04) having a low level when the judgment fuse circuit JFS and the fuse circuit FS (FS0 to FS4) are programmed. The fuse circuits FS0 to FS4 and the judgment fuse circuit JFS may be non-volatile memory cells.

The pre-charge circuit 18 includes PMOS transistors, drains of which are coupled to respective fuse address signal lines FA00 to FA04, and a logic circuit which outputs the fuse enable signal FEN0 obtained by inverting a logic of the fuse judgment signal bFLTJ, as the judgment enable signal JEN0.

Each of the PMOS transistors is turned on when the fuse enable signal FEN0 is at a low level (that is, the judgment fuse circuit JFS is not programmed and the fuse latch circuit 16 is not used) and pre-charges the fuse address signal FA (FA00 to FA04) to a high level (an internal power supply voltage VII). Thus, when the redundancy memory cell RMC is not used, the pre-charge circuit 18 keeps an electric potential of the signal line, which supplies the defective addresses FA00 to FA04 to the comparator circuit 22 (in FIG. 1), constant.

The logic circuit includes two NOR gates coupled in series and an inverter. A test signal TMEAD is set to a high level when the judgment enable signal JEN0 having a low level that disables a program state of the fuse latch circuit 16 (to mask the fuse enable signal FEN0 having the high level) is output. A test signal CAX is set to an high level before programming the fuse latch circuit 16 when the judgment enable signal JEN0 having the high level is forcibly output. A test of the memory MEM with the test signals TMEAD and the test signal CAX is carried out based on settings of given values for a test register (not shown) of the mode register 14 in FIG. 1.

The clamp circuit 20 in FIG. 4 includes a latch circuit that clamps the fuse address signal FA (FA00 to FA04) and outputs the fuse address signal CFA (CFA00 to CFA04). The clamp circuit 20 keeps the fuse address signal FA (FA00 to FA04) at a high level when the judgment fuse circuit JFS is programmed and the fuse circuit FS (FS0 to FS4) is not programmed. The clamp circuit 20 prevents unintended access to the real memory cell MC or the redundancy memory cell RMC which occurs due to supply of an erroneous defective address to the comparator circuit 22 (in FIG. 1). Thus the clamp circuit 20 prevents malfunctions of the memory MEM.

FIG. 5 illustrates the comparator circuits 22, the judgment circuits 24, and the OR circuit 26 according to the first embodiment. Two comparator circuits 22 have the same or a similar configuration with each other. Two (2) judgment circuits 24 have the same or similar configurations to each other. Here, the comparator circuit 22 and the judgment circuit 24 corresponding to the redundancy column enable signal SCLE0 will be disclosed.

The comparator circuit 22 and the judgment circuit 24 corresponding to the redundancy column enable signal SCLE0 performs redundancy judgment based on the defective addresses FA00 to FA04 (CFA00 to CFA04) and outputs the hit signals PHIT00 and PHIT01 corresponding to the first bit group BG1 and the second bit group BG2. The comparator circuit 22 and the judgment circuit 24 corresponding to the redundancy column enable signal SCLE1 perform the redundancy judgment based on the defective addresses FA10 to FA14 (CFA10 to CFA14) and output the hit signals PHIT10 and PHIT11 corresponding to the first bit group BG1 and the second bit group BG2. The two (2) judgment circuits 24 judge whether to relieve the first bit group BG1 or not based on the defective addresses FA00 to FA04 or the defective addresses FA10 to FA14 to output the hit signals PHIT00 and PHIT10, and judge whether to relieve the second bit group BG2 that is different from the first bit group BG1 or not to output the hit signals PHIT01 and PHIT11.

The comparator circuit 22 includes a plurality of ENOR gates that compare the column address signal CAD (CAD0 to CAD4; input addresses) with the fuse address signal CFA (CFA00 to CFA04; defective addresses). When the bit values of the address signals are coincident with each other, each of the ENOR gates outputs the fuse address signal CFA (CFA00 to CFA04) having a high level.

The judgment circuit 24 includes a judgment circuit JDG1 and a judgment circuit JDG2. In the normal operation mode (bTEST=high level), when all the fuse address signals CFA00 to CFA04 from the comparator circuit 22 are at the high level, the judgment circuit JDG1 outputs the redundancy column enable signal SCLE0 having the high level in order to activate the redundancy column selection line SCSL0.

In the compression test mode (bTEST=low level), when all the fuse address signals CFA00 to CFA03 are at the high level, the judgment circuit JDG1 outputs the redundancy column enable signal SCLE0 having the high level. The judgment circuit JDG1 outputs the redundancy column enable signal SCLE0 having the high level when any of the fuse address signals CFA00 to CFA03 are at the high level. In the normal operation mode and the compression test mode, the judgment circuit JDG1 judges whether to relieve the defect or not based on the given bits CAD0 to CAD4 or CAD0 to CAD3 of the input address AD and outputs the redundancy column enable signal SCLE0.

In the compression test mode, when the first bit group BG1 is relieved, one of the judgment circuits JDG1 outputs the redundancy column enable signal SCLE0 having the high level which activates the redundancy column selection signal SCSL0 corresponding to the first bit group BG1. The other judgment circuit JDG1 outputs the redundancy column enable signal SCLE0 having a low level which activates the column selection lines CSL16 to CSL31 corresponding to the second bit groups BG2.

The judgment circuit JDG2 outputs the redundancy test signals PHIT00 or PHIT01 based on the bit CAD4 (FA04), for identifying the bit group BG1 and the bit group BG2, of the input address AD. In the normal operation mode, when the redundancy column enable signal SCLE0 having the high level is output, the judgment circuit JDG2 outputs the hit signals PHIT00 and PHIT01 having the high level. In the compression test mode, when the redundancy column enable signal SCLE0 having the high level is output, the judgment circuit JDG2 sets the hit signal PHIT00 or PHIT01 corresponding to the bit group BG1 or the bit group BG2 indicated by the fuse address signal FA04 (the upper bit of the defective address) to the high level.

In the normal operation mode, the judgment circuit JDG2 outputs both hit signals PHIT00 and PHIT01 corresponding to the plurality of bit groups BG1 and BG2, based on a judgment result of the judgment circuit JDG1. In the test mode, the judgment circuit JDG2 outputs the hit signal PHIT00 or PHIT01 corresponding to the defective address FA04, based on the judgment result and the defective address FA04.

The OR circuit 26 includes a NOR circuit which inverts the OR logic of the hit signals PHIT00 and PHIT10 to output the hit signal bHIT0 and a NOR circuit which inverts the OR logic of the hit signals PHIT10 and PHIT11 to output the hit signal bHIT1.

Figure 6:
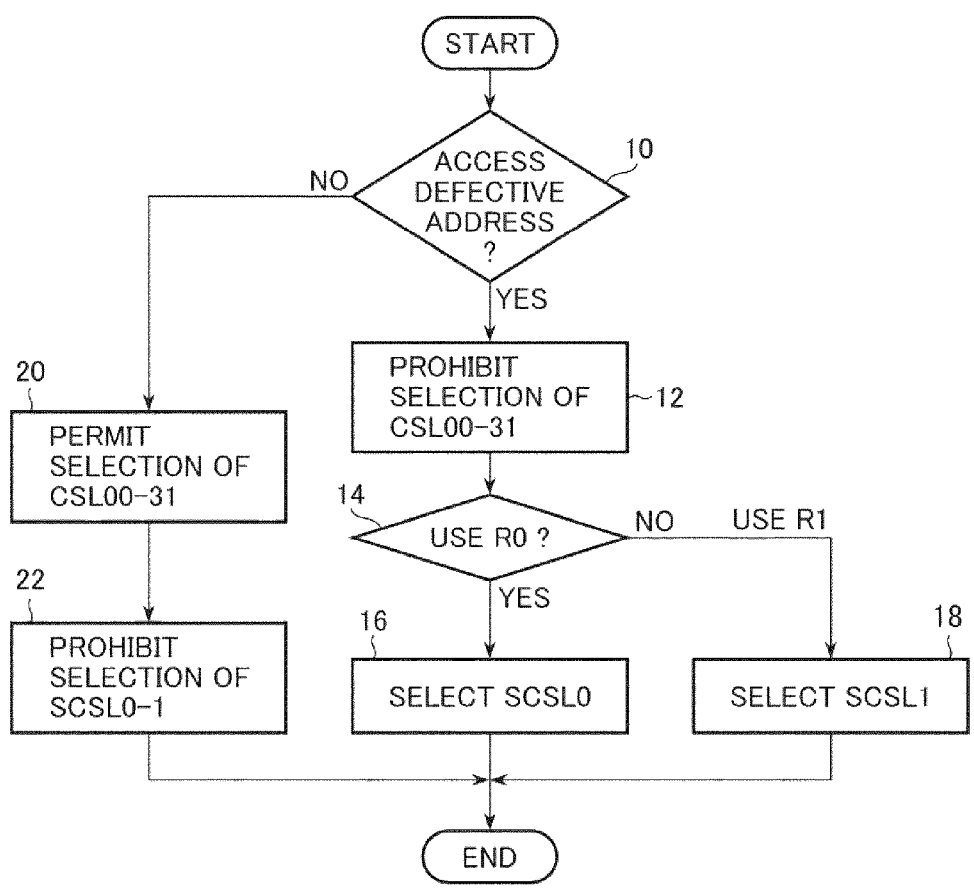
FIG. 6 illustrates operations, in a normal operation mode, of the judgment circuit according to the first embodiment.

FIG. 6 illustrates operations, in the normal operation mode, of the judgment circuit 24 according to the first embodiment. Operations 10 through 22 in FIG. 6 are not carried out sequentially, branch by branch, but carried out branch by branch in the read operation or in the write operation.

In operation 10, the judgment circuit JDG1 judges whether the addresses CAD0 to CAD4 supplied from outside of the memory MEM are defective addresses or not. That is, the judgment circuit JDG1 judges whether the defective addresses stored in the fuse circuits FS0 to FS4 have been accessed or not. Judgment in operation 10 is made in response to output levels of a three-input NOR circuit in the judgment circuit JDG1.

When a defective address has been accessed, in other words, when the three-input NOR circuit outputs a high level, a selection of all the column selection lines CSL00 to CSL31 is prohibited in operation 12. The selection of the column selection lines CSL00 to CSL31 is prohibited by the high level of the hit signals PHIT00 and PHIT01 (or PHIT10 and PHIT11). The judgment circuit JDG2 performs operation 12.

In operation 14, it is judged which of the three-input NOR circuit in the judgment circuit JDG1 corresponding to the redundancy column enable signal SCLE0 and the three-input NOR circuit in the judgment circuit JDG1 corresponding to the redundancy column enable signal SCLE1 outputs the high level. When the redundancy column enable signal SCLE0 from the logic circuit R0 is activated, process proceeds to operation 16. When the redundancy column enable signal SCLE1 from the logic circuit R1 is activated, the process proceeds to operation 18.

In operation 16, to select the redundancy column selection line SCSL0, the redundancy column enable signal SCLE0 from one of the judgment circuits JDG1 is activated to the high level. In the operation 18, to select the redundancy column selection line SCSL1, the redundancy column enable signal SCLE1 from the other judgment circuit JDG1 is activated to the high level. Thereafter, data is read out from the redundancy memory cell RMC or the data is written to the redundancy memory cell RMC.

When the defective address is not accessed, in other words, when the three-input NOR circuit outputs a low level, a selection of the column selection lines CSL00 to CSL31 is permitted in operation 20. The selection of the column selection lines CSL00 to CSL31 is permitted based on the hit signal PHIT00 and PHIT01 (or PHIT10 and PHIT1) having a low level. The judgment circuit JDG2 carries out operation 20.

In operation 22, since a selection of the redundancy column selection lines SCSL0 to SCSL1 is prohibited, the redundancy column enable signals SCLE0 and SCLE1 are deactivated to the low level and the hit signals PHIT00 and PHIT01 and the hit signals PHIT10 and PHIT11 are deactivated to the low level. The judgment circuit JDG1 and the judgment circuit JDG2 carry out operation 20. Thereafter, the data is read out from the real memory cell MC or the data is written in the real memory cell MC.

Figure 7:
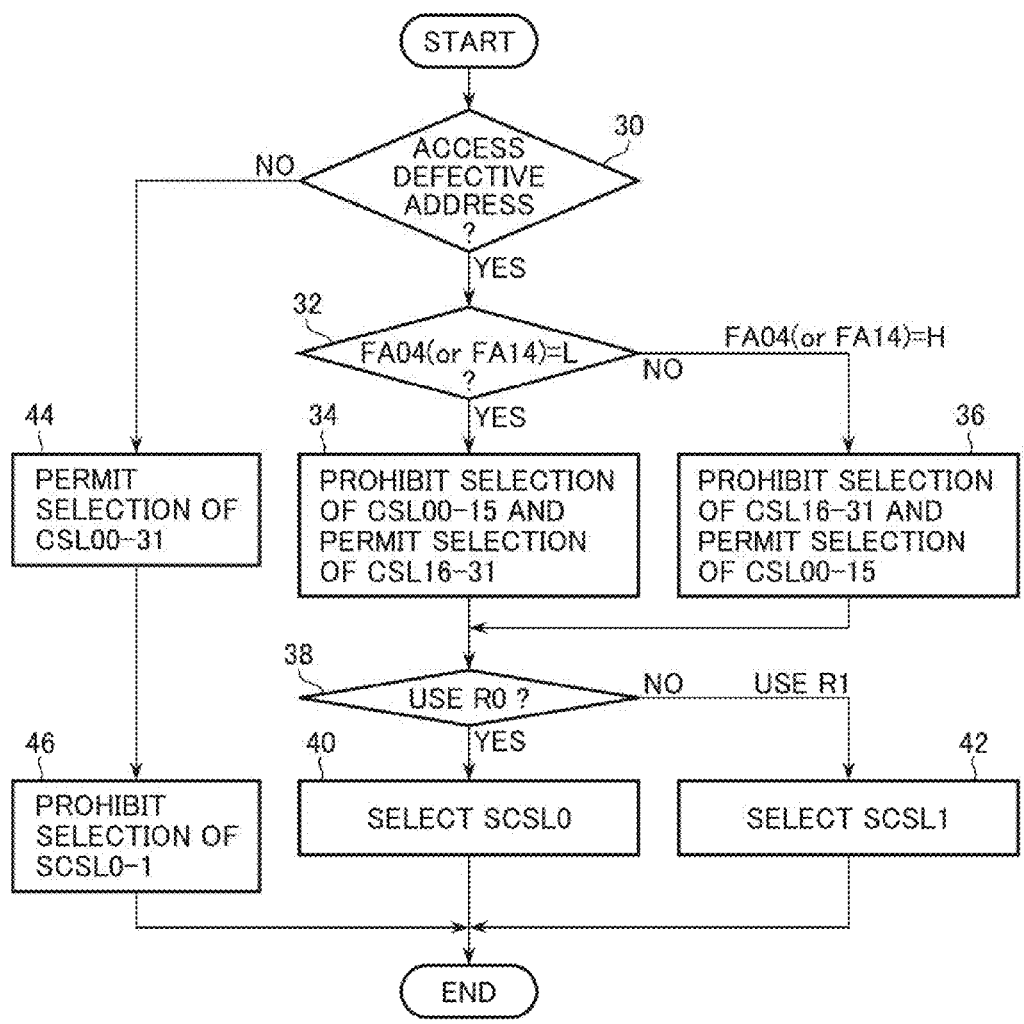
FIG. 7 illustrates operations, in a compression test mode, of the judgment circuit according to the first embodiment.

FIG. 7 illustrates operations, in the compression test mode, of the judgment circuit 24 according to the first embodiment. Operations 30, 38, 40, 42, 44 and 46 in FIG. 7 are the same as respective operations 10, 14, 16, 18, 20 and 22 in FIG. 6. Operations 30 through 46 in FIG. 7 are not sequentially carried out branch by branch, but carried out branch by branch in the read operation and in the write operation.

In operation 30 that is the same as operation 10 in FIG. 6, a judgment is made on whether or not the defective addresses FA00 to FA04 (or FA10 to FA14) have been accessed. That is to say, a judgment on whether the real memory cell MC is relieved or not is made, by comparing the input address CAD and the defective address FA.

In operation 32, when the defective address has been accessed, whether the upper bit in the defective address FA04 (or FA14) is at a low level or a high level is judged. In other words, whether the defective address belongs to the column selection lines CSL00 to CSL15 or the column selection lines CSL16 to CSL31 is judged. The judgment circuit JDG2 carries out operation 34.

When the defective address FA04 (or FA14) is at the low level, in operation 34, the selection of the column selection lines CSL00 to CSL15 (the first bit group BG1) which include the defective addresses is prohibited, while the selection of the column selection lines CSL16 to CSL31 (the second bit group BG2) is permitted. That is to say, the judgment circuit JDG2 activates the hit signal PHIT00 (or PHIT10) to the high level and deactivates the hit signal PHIT01 (or PHIT11) to the low level.

When the defective address FA04 (or FA14) is at the high level, in operation 36, the selection of the column selection lines CSL16 to CSL31 (the second bit group BG2) including the defective address is prohibited, while the selection of the column selection lines CSL00 to CSL15 (the first bit group BG1) is permitted. In other words, the judgment circuit JDG2 activates the hit signal PHIT01 (or PHIT11) to the high level and deactivates the hit signal PHIT00 (or PHIT10) to the low level. In the first embodiment, the judgment circuit 24 with a simple logic only prohibits a selection of a column selection line group CSL including the defective address, while it permits the selection of the column selection line group CSL that does not include the defective address.

FIG. 8 illustrates operations, in the normal mode operations, of the memory MEM according to the first embodiment. Block arrows in FIG. 8 indicate supply of the read commands or the write commands (FIG. 8(a)). The column pulse signal CLP is activated to a high level for a predetermined period in response to the read commands or the write commands (FIG. 8(b)).

In an example illustrated in FIG. 8, the real memory cell MC, the bit lines BL and/BL, or the sense amplifier SA corresponding to the underlined column address lines CSL00 and CSL31 has a defect. For the above reason, the redundancy column selection line SCSL0 is used instead of the column selection line CSL00 (FIG. 8(c)). The redundancy column selection line SCSL1 is used instead of the column selection line CSL31 (FIG. 8(d)). The fuse circuits FS0 to FS4 corresponding to the redundancy column selection line SCSL0 store the defective address "00000"=0 and output the fuse address FA04 having a low (FIG. 8(e)). The fuse circuits FS0 to FS4 corresponding to the redundancy column selection line SCSL1 store the defective address "11111"=31 and output the fuse address FA14 having the high level (FIG. 8(f)).

When the column address signals CAD0 to CAD4 ("00000"=0) are supplied to the memory MEM along with the access command, the comparator circuit 22 in FIG. 5 sets all the bits of the coincidence address signals FCAD00 to FCAD04 to the high level (FIG. 8(g)). Since the coincidence address signals FCAD00 to FCAD04 are at the high level and the test mode signal bTEST is at the high level, both the hit signals PHIT00 and PHIT01 are activated to the high level and both the hit signals bHIT0 and bHIT1 are activated to the low level (FIGS. 8(h and i)).

Activation of the column selection lines CSL00 to CSL31 is prohibited by the hit signals bHIT0 and bHIT1 having the low level (FIG. 8(j)). In the normal operation mode, when the first bit group BG1 is relieved, the judgment circuit 24 does not select the column selection lines CSL00 to CSL15 corresponding to the first bit group BG1 nor the column selection lines CSL16 to CSL31 corresponding to the second bit group BG2.

Based on the coincidence address signals FCAD00 to FCAD04 having the high level, the redundancy column enable signal SCLE0 (in FIG. 5) is activated and the redundancy column selection signal SCSL0 is activated in synchronization with the column pulse signal CLP (FIG. 8(k)). Based on the activated redundancy column selection signal SCSL0, an access operation to the redundancy memory cell RMC is performed.

When the column address signals CAD0 to CAD4 are not defective addresses, as indicated by the hatched areas in FIG. 8, at least one of the coincidence address signals FCAD00 to FCAD04 and at least one of the coincidence address signals FCAD10 to FCAD14 are set to a low level (FIGS. 8(l and m)). This causes the redundancy column enable signals SCLE0 and SCLE1, the hit signals PHIT00 and PHIT01, the hit signals PHIT10 and PHIT11, and the hit signals bHIT0 and bHIT1 to be deactivated (FIGS. 8(n, o and P)). As a result of the deactivation of the above signals, any of the column selection lines CSL01 to CSL30 corresponding to the column address signals CAD0 to CAD4 may be activated (FIG. 8(q)), and then an access operation of the real memory cell MC is performed.

When the column address signals CAD0 to CAD4 ("11111"=31) are supplied to the memory MEM along with the access command, the comparator circuit 22 illustrated in FIG. 5 sets all the bits of the coincidence address signals FCAD10 to FCAD14 to the high level (FIG. 8(r)). In response to the coincidence address signals FCAD10 to FCAD14 having the high level, both the hit signals PHIT10 and PHIT11 are activated and both the hit signals bHIT0 and bHIT1 are activated (FIGS. 8(s and t)). The redundancy column enable signal SCLE1 (in FIG. 5) is activated and the redundancy column selection line SCSL1 is activated in synchronization with the column pulse signal CLP (FIG. 8(u)), and then the access to the redundancy memory cell RMC is performed.

FIG. 9 illustrates operations, in the normal operation mode, of the memory MEM according to the first embodiment. Description of the same operations as those in FIG. 8 is reduced or omitted. In an example illustrated in FIG. 9, contrary to the example in FIG. 8, the fuse circuits FS0 to FS4 corresponding to the redundancy column selection line SCSL0 store the defective address "11111"=31 and output the fuse address signal FA04 having the high level (FIG. 9(a)). The fuse circuits FS0 to FS4 corresponding to the redundancy column selection line SCSL1 store the defective address "00000"=0 and output the fuse address signal FA14 having the low level (FIG. 9(b)). Based on the fuse address signal FA04 having the high level and the fuse address signal FA14 having the low level, the redundancy column section line SCSL1 is used instead of the column selection line CSL00 (FIG. 9(c)), and the redundancy column selection line SCSL0 is used instead of the column selection line CSL31 (FIG. 9(d)).

When the column address signals CAD0 to CAD4 ("00000"=0) are supplied to the memory MEM along with the access command, both the hit signals PHIT10 and pHIT11 and both the hit signals bHIT0 and bHIT1 are activated (FIGS. 9(e and f)). The redundancy column enable signal SCLE1 (in FIG. 5) is activated and the redundancy column selection signal corresponding to the redundancy column selection line SCSL1 is activated in synchronization with the column pulse signal CLP (FIG. 9(g)), and then the access operation to the redundancy memory cell RMC is performed.

When the column address signals CAD0 to CAD4 ("11111"=31) are supplied to the memory MEM along with the access command, both the hit signals PHIT00 and PHIT01 and both the hit signals bHIT0 and bHIT1 are activated (FIGS. 9(h and i)). The redundancy column enable signal SCLE1 (in FIG. 5) is activated and the redundancy column selection signal corresponding to the redundancy column selection line SCSL1 is activated in synchronization with the column pulse signal CLP (FIG. 9(j)), and then the access operation to the redundancy memory cell RMC is performed.

FIG. 10 illustrates operations, in the compression test mode, of the memory MEM according to the first embodiment. Description of the same operations as those in FIG. 8 is reduced or omitted. In an example illustrated in FIG. 10, the column address signals CAD0 to CAD4 supplied along with the access command and the defective addresses FA00 to FA04 and FA10 to FA14 stored in a pair of fuse circuit groups FS0 to FS4 which correspond to the redundancy column selection lines SCSL0 and SCSL1 are the same as the examples illustrated in FIG. 8.

In the compression test mode, since the test mode signal bTEST is at the low level, when the redundancy column enable signal SCLE0 (or SCLE1) is activated, the judgment circuit JDG2 activates one of the hit signals PHIT00 or PHIT01 (or PHIT10 and the PHIT11) in response to the fuse address signal FA04 (or FA14). When the column address signals CAD0 to CAD4 ("00000"=0) are supplied to the memory MEM, only the hit signal PHIT00 is activated and only the hit signal bHIT0 is activated (FIGS. 10(a and b)). The judgment circuit JDG1 masks the coincidence address signal FCAD04, and then the judgment circuit JDG1 activates the redundancy column enable signal SCLE0 (in FIG. 5) in response to the coincidence address signals FCAD00 to FCAD03 having the high level. The activated redundancy column enable signal SCLE0 causes the redundancy column selection line SCSL0 to be activated instead of the column selection line CSL00 (FIG. 10(c)).

With the test mode signal bTEST having the low level, the pre-decoder PDEC illustrated in FIG. 2 masks the upper column address signal CAD4 and outputs the column decode signals CA234 [<0:7> in response to the column address signals CAD0 to CAD3. Since the hit signal PHIT01 and the hit signal bHIT1 are not activated, the column selection lines CSL16 to CSL31 are selectable. In consequence, when the column address signals CAD0 to CAD4 ("00000"=0) are supplied, the column selection line CSL16 is activated along with the redundancy column selection line SCSL0 (FIG. 10(d)). Based on the activated redundancy column selection line SCSL0 and the column selection line CSL16, the access operations to the real memory cell MC and the redundancy memory cell RMC are contemporaneously performed. One column address signal CAD is treated as two column address signals CAD (degeneration of address signals) and an address compression test is executed in which the data signal received at one data terminal DQ is written in the plurality of memory cells MC and the redundancy memory cells RMC.

When the column address signals CAD0 to CAD4 that are not the defective addresses are supplied, the hit signals PHIT00 and the PHIT11 and the hit signals bHIT0 and bHIT1 are not activated (FIGS. 10(e and f)). In consequence, the pre-decoder PDEC (in FIG. 2) contemporaneously sets two of the column decode signals CA234 <0:7> to the high level in response to the column address signals CAD0 to CAD3. For the above reason, the column selection lines CSL01 and CSL17 are contemporaneously activated (FIGS. 10(g and h)).

When the column address signals CAD0 to CAD4 ("01111"=15) are supplied, the judgment circuit JDG1 activates the redundancy column enable signal SCLE1 (in FIG. 5), in response to the coincidence address signals FCAD10 to FCAD13 having the high level. Based on the activated redundancy column enable signal SCLE1, the redundancy column selection line SCSL1 is activated (FIG. 10(i)). Since the judgment circuit JDG2 only activates the hit signal PHIT11, only the hit signal bHIT1 is activated (FIGS. 10(j and k)). The pre-decoder PDEC (in FIG. 2) outputs the column decode signals CA234 [3] and CA234 [7] in response to the column address signals CAD2 and CAD3 ("11"). Since the hit signal PHIT10 and the hit signal bHIT0 are not activated, the column selection line CSL15 is activated (FIG. 10(l)).

When the column address signals CAD0 to CAD4 ("10000"=16) are supplied, the hit signal PHIT00 is activated and the hit signal bHIT0 is activated (FIGS. 10(m and n)). The pre-decoder PDEC (in FIG. 2) outputs the column decode signals CA234 [0] and CA234 [4] in response to the column address signals CAD2 and CAD3 ("00"). For the above reason, the column selection line CSL16 and the redundancy column selection line SCSL0 are contemporaneously activated (FIGS. 10(o and p)), and the address compression test is initiated.

When the column address signals CAD0 to CAD4 ("11111"=31) are supplied, the column selection line CSL15 and the redundancy column selection line SCSL1 are contemporaneously activated (FIGS. 10(q and r)), and the address compression test is initiated. An input of one of the column address signals CAD0 to CAD4 causes test data to be written to the plurality of memory cells MC or the redundancy memory cell RMC with respect to each data terminal DQ. Moreover, the test data read out from the plurality of memory cells MC and the redundancy memory cell RMC is compared with an expected value. The defective memory cell MEM is removed in a manufacturing process of the memory MEM. In the manufacturing process of the memory MEM, for example, the address compression test may be carried out with an LSI tester.

FIG. 11 illustrates operations of the memory MEM in a compression test mode according to the first embodiment. Description of the same operations as those in FIG. 10 is reduced or omitted. As in the example in FIG. 9, the redundancy column selection line SCSL1, in the example illustrated in FIG. 11, is used instead of the column selection line CSL00 (FIG. 11(a)), and the redundancy column selection line SCSL0 is used instead of the column selection line CSL31 (FIG. 11(b)).

When the column address signals CAD0 to CAD4 ("00000"=0 or "10000"=16) are supplied, the redundancy column selection line SCSL1 is activated (FIGS. 11(c and d)). When the column address signals CAD0 to CAD4 ("01111"=15 or "11111"=31) are supplied, the redundancy column selection line SCSL0 is activated (FIGS. 11(e and f)). The other operations are the same as those in FIG. 10. An input of one of the column address signals CAD0 to CAD4 causes test data to be written to the plurality of memory cells MC or the redundancy memory cell RMC, with respect to each data terminal DQ. The test data read out from the plurality of memory cells MC or the redundancy memory cell RMC is compared with the expected value. In the manufacturing process of the memory MEM, for example, the address compression test may be performed using the LSI tester.

Figure 12:
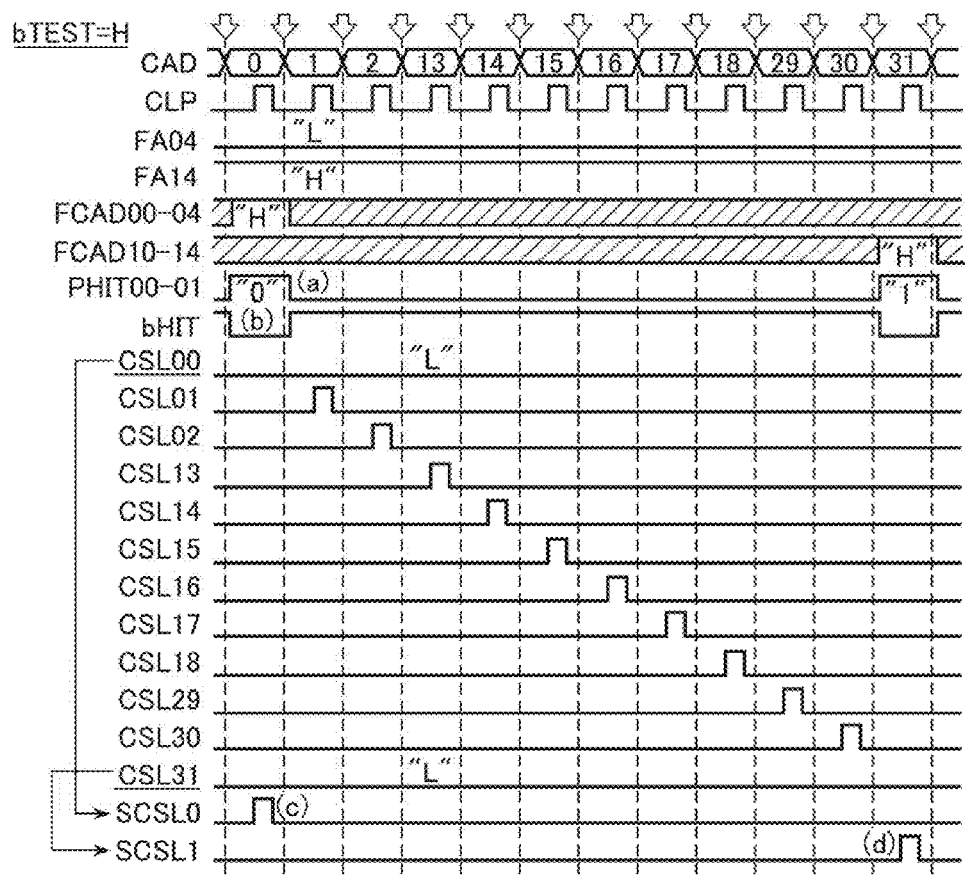
FIG. 12 illustrates operations of the memory in a normal operation mode.

FIG. 12 illustrates operations, in the normal operation, of the memory MEM mode according to the first embodiment. Description of the same operations as those in FIG. 8 is reduced or omitted. In an example illustrated in FIG. 10, the column address signals CAD0 to CAD4 supplied along with the access command and the defective addresses FA00 to FA04 and FA10 to FA14, which are stored in the pair of fuse circuit groups FS0 to FS4 corresponding to the column selection lines SCSL0 to SDCSL1, are the same as the address signals illustrated in FIG. 8. Operations of the judgment circuit are the same as those illustrated in FIG. 6.

In an example illustrated in FIG. 12, each of the pair of judgment circuits (in FIG. 5) outputs only one hit signal PHIT00 or PHIT01 (FIG. 12(a)). The hit signal bHIT changes to the low level when any of the hit signals PHIT00 and PHIT01 is at the high level (FIG. 12(b)). When any of the defective addresses stored in the pair of fuse latch circuits are accessed, the hit signal bHIT is activated and the activation of the column selection lines CSL00 to CSL31 is prohibited.

The redundancy column selection line SCSL0 is activated when the column address signals CAD0 to CAD4 ("00000"=0) are supplied to the memory MEM and all the bits of the coincidence address signals FCAD00 to FCAD04 change to the high level (FIG. 12(c)). The redundancy column selection line SCSL1 is activated when the column address signals CAD0 to CAD4 ("11111"=31) are supplied to the memory MEM and all the bits of the coincidence address signals FCAD10 to FCAD14 change to the high level (FIG. 12(d)).

Figure 13:
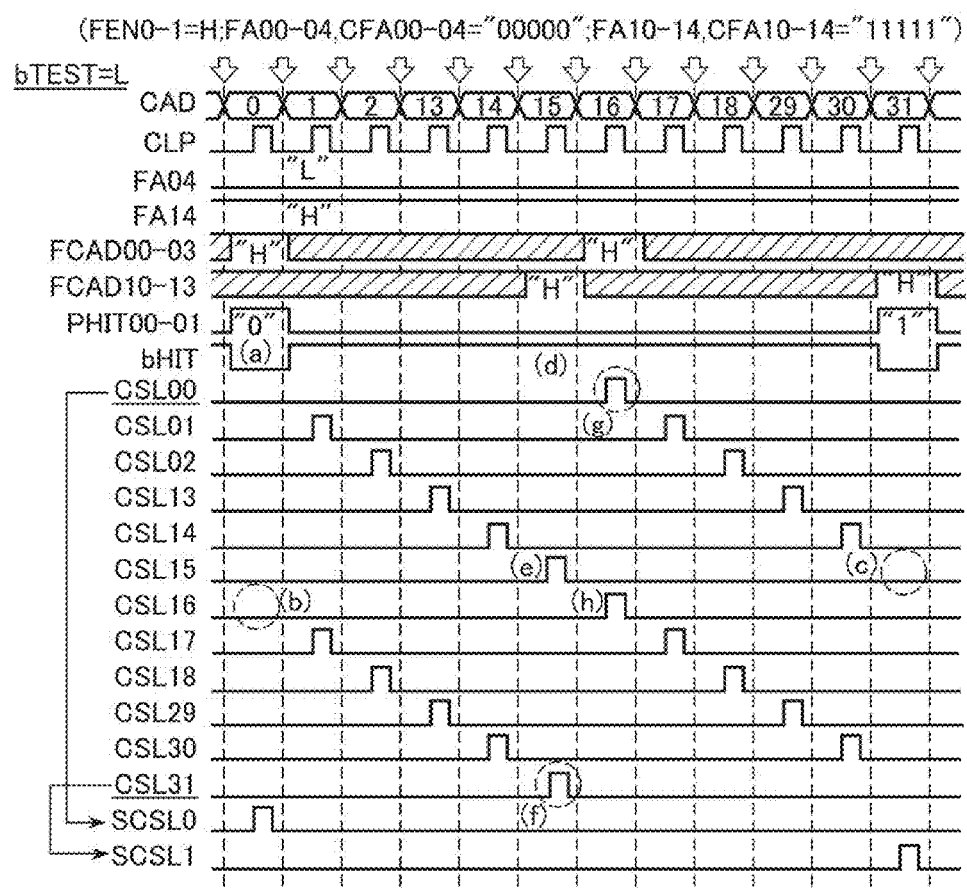
FIG. 13 illustrates operations of the memory in a compression test mode.

FIG. 13 illustrates operations of the memory MEM in the compression test mode. Description of the same operations as those in FIG. 10 is reduced or omitted. In an example illustrated in FIG. 13, the column address signals CAD0 to CAD4 supplied along with the access command and defective addresses FA00 to FA04 and FA10 to FA14, which are stored in the pair of fuse circuit groups FS0 to FS4 corresponding to the redundancy column selection lines SCSL0 to SCSL1, are the same as the address signals illustrated in FIGS. 8 and 10. Circles with dotted lines in FIG. 13 indicate defective waveforms. The operation of the judgment circuit is the same as that illustrated in FIG. 6.

The hit signal bHIT changes to the low level when any of the hit signals PHIT00 and PHIT01 is at the high level (FIG. 13(a)). Based on the hit signal bHIT, the activation of the column selection lines CSL00 to CSL31 is prohibited. In consequence, even if the pre-decoder PDEC illustrated in FIG. 2 contemporaneously sets two of the column decode signals CA234 <0:7> to the high level, the column decode signals CA234 <0:7> are masked by the hit signal bHIT. Thus, since the column selection lines CSL16 and CSL15 are not activated (FIGS. 13(b and c)) the address compression test cannot be carried out at the time of access to the defective address.

On the other hand, in the address compression test, when the column address signals CAD0 to CAD4 ("01111"=15) that are not the defective addresses are supplied, the hit signals PHIT00 and PHIT01 and the hit signal bHIT are not activated. For the above reason, based on the high level column decode signals CA234 [3] and CA234 [7] output from the pre-decoder PDEC (in FIG. 2), the column selection lines CSL15 and CSL31 are activated (FIGS. 13(e and f)). Since the column selection line CSL31 has the defective address, the memory MEM malfunctions. In the access of the column address signals CAD0 to CAD4 ("10000"=16) that are not the defective addresses, the column selection lines CSL00 and CSL16 are activated (FIGS. 13(g and h)), and the memory MEM similarly malfunctions.

In the compression test, when a bit group with a defect and another bit group without a defect are contemporaneously accessed, only the redundancy memory cell is accessed instead of the bit group with the defect, and the bit group without the defect may not be accessed. On the other hand, when the access to the bit group without the defect occurs, the redundancy memory cell may not be accessed instead of the bit groups with the defect. That is to say, when the redundancy memory cell is used in the compression test, the semiconductor memory malfunctions. In consequence, when the redundancy memory cell is used, the compression test may not be performed.

In the first embodiment, when the compression test is performed by degenerating a part of the bits of the column address signals CAD0 to CAD4, the bit group BG without the defect (e.g. BG1) and the redundancy memory cell RMC can be accessed contemporaneously. Thus, the malfunction of the memory MEM can be prevented when the compression test using the redundancy memory cell RMC is performed. In the first embodiment, not only test time but also test costs can be reduced.

Figure 14:
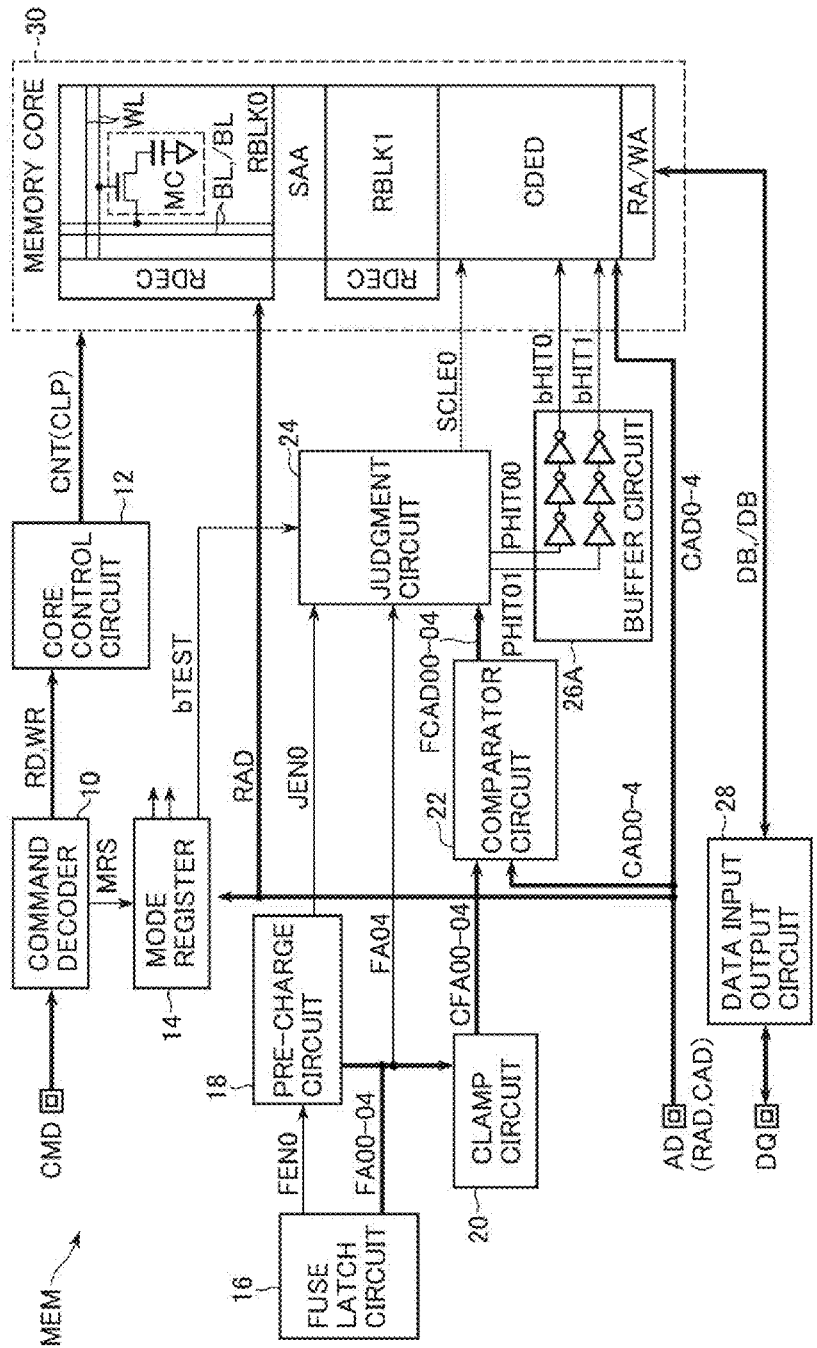
FIG. 14 illustrates a second embodiment.

FIG. 14 illustrates a second embodiment. In the second embodiment, descriptions of the elements attached with the same symbols and reference numerals as those in the foregoing first embodiment are reduced or omitted. In the second embodiment, a fuse latch circuit 16, a pre-charge circuit 18, a clamp circuit 20, a comparator circuit 22, and a judgment circuit 24 are provided and only correspond to a redundancy column selection line SCSL0 illustrated in FIG. 15. In the second embodiment, only one redundancy column selection line SCSL0 is provided. In the second embodiment, a buffer circuit 26A is provided instead of an OR circuit 26 in FIG. 1. The buffer circuit 26A outputs a hit signal bHIT0 inverted from a logic of a hit signal PHIT00 and outputs a hit signal bHIT1 inverted from a logic of a hit signal PHIT01. Other structures in the second embodiment are the same as structures illustrated in FIGS. 1 to 5. A semiconductor memory MEM in the second embodiment is a fast cycle RAM (FCRAM) of pseudo SRAM type as the semiconductor memory as illustrated in FIG. 1 is a FCRAM.

Figure 15:
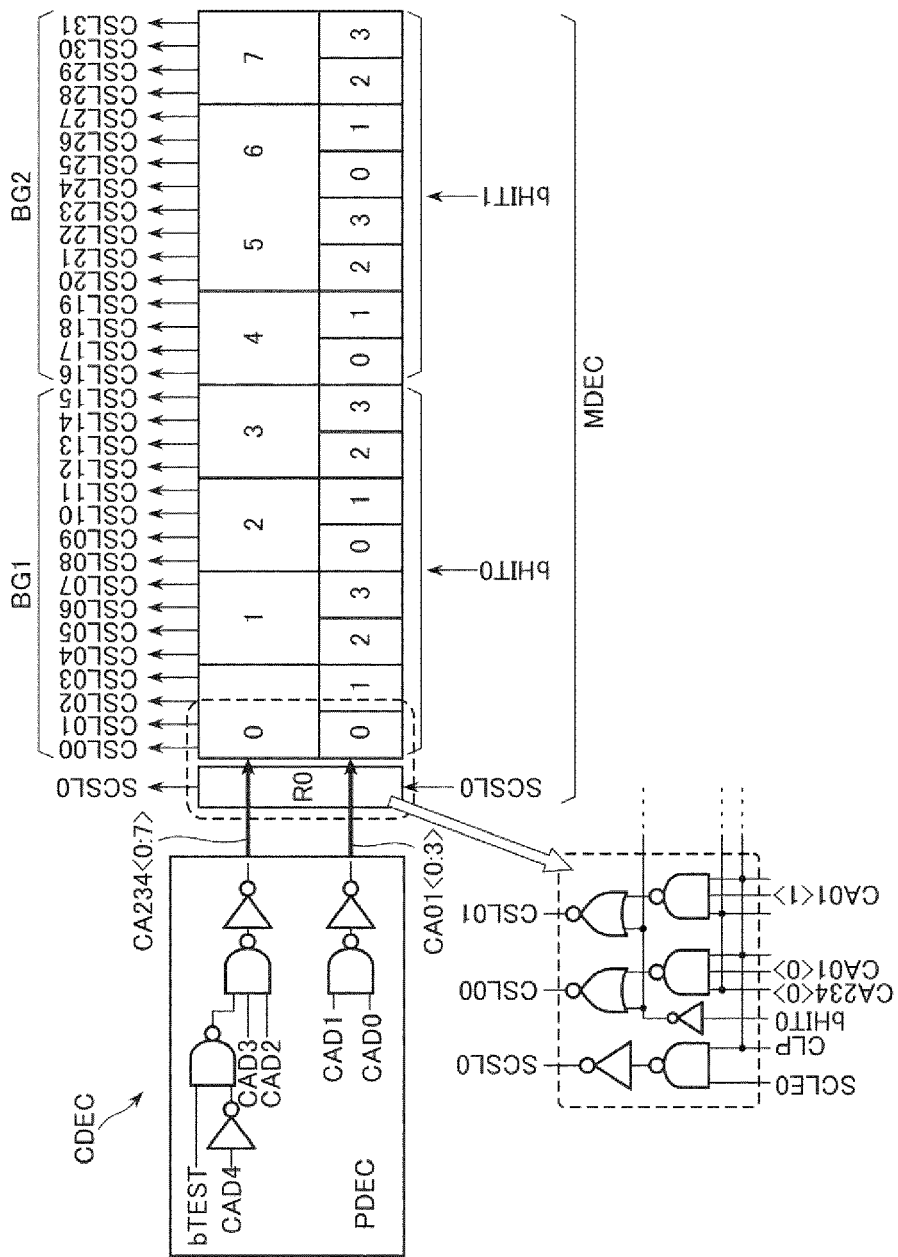
FIG. 15 illustrates a column decoder according to the second embodiment.

FIG. 15 illustrates a column decoder CDEC in the second embodiment. Descriptions of the elements in the second embodiment that are the same as those in FIG. 2 are reduced or omitted. The second embodiment does not include a logic circuit R1 that generates a redundancy column selection signal corresponding to the redundancy column selection line SCSL1 in FIG. 2. Other structures in the second embodiment are the same as or similar to structures illustrated in FIG. 2.

Figure 16:
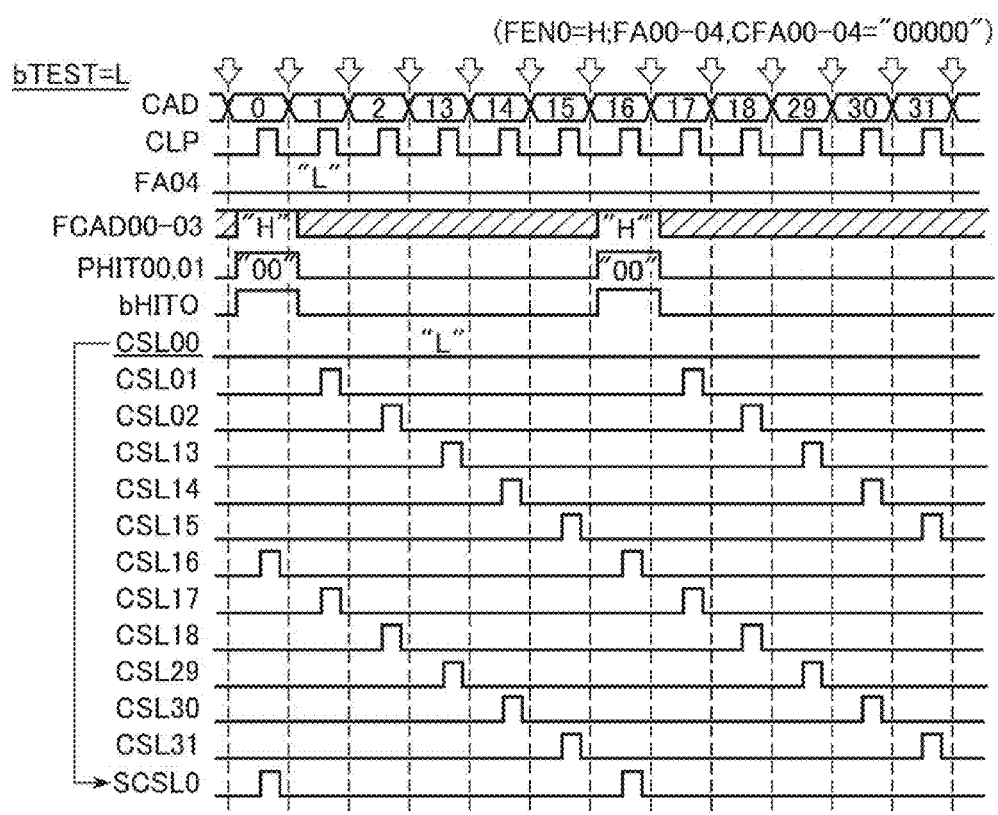
FIG. 16 illustrates operations, in a compression test mode, of a memory according to the second embodiment.

FIG. 16 illustrates operations, in a compression test mode, of the memory MEM according to the second embodiment. Descriptions of the operations that are the same as those in FIG. 8 are reduced or omitted. In the example illustrated in FIG. 16, column address signals CAD0 to CAD4 supplied along with an access command and defective addresses FA00 to FA04, which are stored in fuse circuits FS0 to FS4 corresponding to the redundancy column selection line SCSL0, are the same as the address signal "00000=0" illustrated in FIG. 8.

The operations illustrated in FIG. 16 are the same as or similar to those illustrated in FIG. 10. The difference between the operations in FIG. 16 and those in FIG. 10 is that when the column address signals CAD0 to CAD4 ("01111"=15 and "11111"=31) that are not the defective address are supplied, column selection lines CSL15 and CSL31 are activated. Operations in a normal operation mode are the same as or similar to operations in FIGS. 8 and 9 other than that the column address signals CAD0 to CAD4 ("11111"=31) are not defective addresses.

The second embodiment has the same advantages as those in the first embodiment. In the second embodiment, the memory MEM which relieves a defect in one of bit groups BG1 or BG2 by only using the redundancy column selection line SCSL0 is not only reducing test time but also reducing test costs.

Figure 17:
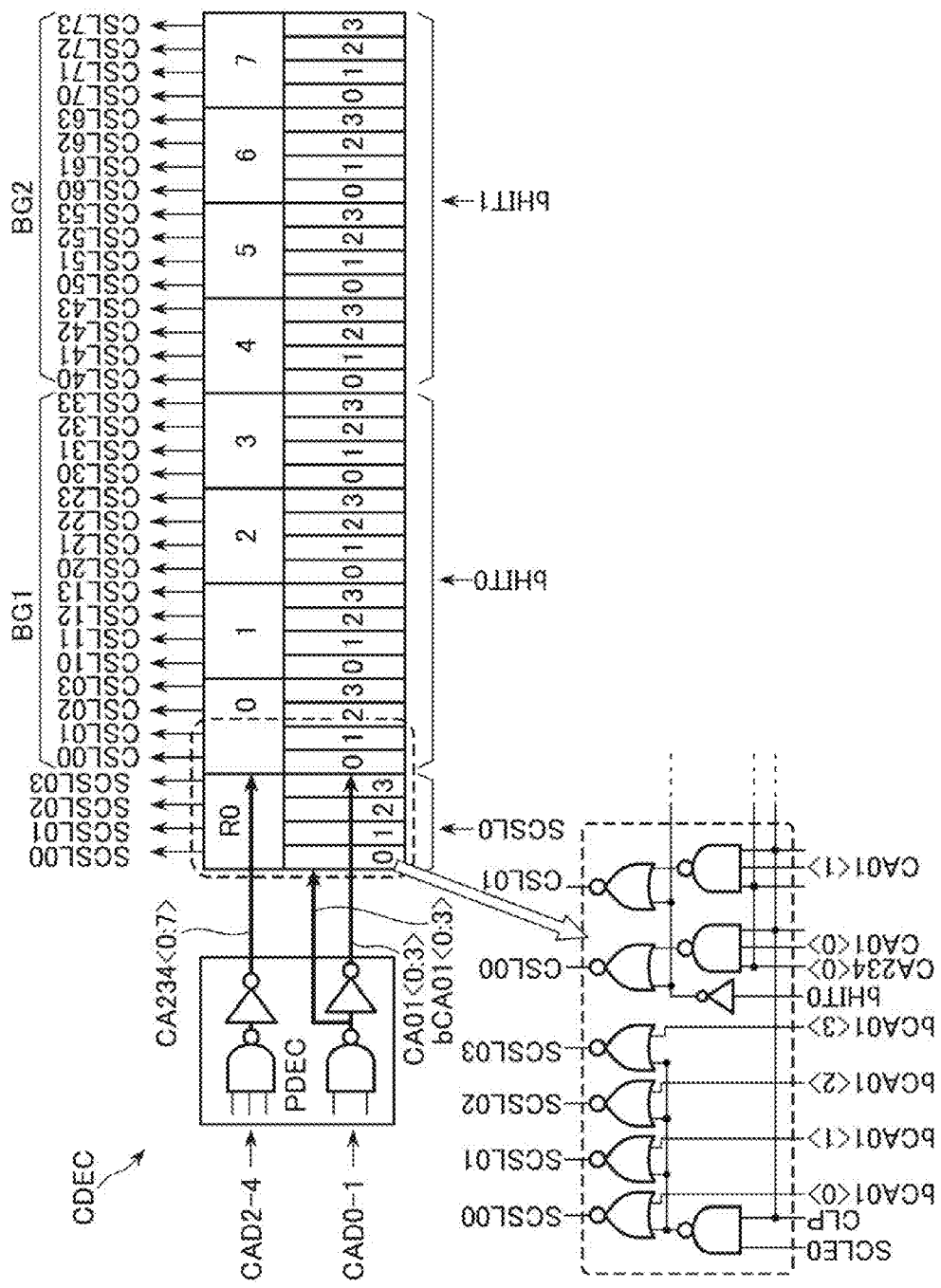
FIG. 17 illustrates a third embodiment.

FIG. 17 illustrated a column decoder CDEC according to a third embodiment. In the third embodiment, the same elements as in the foregoing second embodiment are attached with the same symbols and reference numerals to reduce or omit the description. In the third embodiment, defects are relieved with respect to each of four (4) column selection lines CSL (e.g., CSL00 to CSL03; segment).

Since the number of segments that can be relieved is only one, the third embodiment includes only a logic circuit R0 which generates redundancy column selection signals corresponding to the redundancy column selection lines SCSL00 to SCSL03.

A fuse latch circuit (not shown) has a structure that is the same as or similar to the fuse latch circuit 16 in FIG. 4. The fuse latch circuit includes fuse circuits FS2 to FS4 that store defective bits corresponding to column address signals CAD2 to CAD4. A comparator circuit (not shown) has structure that is the same as or similar to the comparator circuit 22 in FIG. 5. The comparator circuit makes a comparison of the column address signals CAD2 to CAD4 supplied outside a memory MEM and fuse address signals CFA02 to CFA04, and outputs coincidence address signals FCAD02 to FCAD04. A judgment circuit (not shown) has a structure that is the same as or similar to the judgment circuit 24 in FIG. 5. The judgment circuit performs logical operations on the coincidence address signals FCAD02 to FCAD04 and outputs a redundancy column enable signal SCLE0 and hit signals PHIT00 and PHIT01. Other structures in the third embodiment are the same as or similar to the structures in FIGS. 1 to 5.

According to the third embodiment, in a compression test mode, a logic of an upper bit CAD4 in the column address signal CAD is masked (address degeneration), and two column selection lines CSL (e.g., the column address lines CSL00 and CSL40) are contemporaneously activated in response to the column address signals CAD0 to CAD3. When the defective column addresses CAD0 to CAD4 are supplied, one column address line CSL and one of the redundancy column selection lines SCSL00 to SCSL03 are activated, in response to the column address signals CAD0 to CAD2. Operations in a normal operation mode are the same as those in FIGS. 8 and 9 other than that a defect is relieved in units of segments and other than that only the redundancy column selection line SCSL0 is activated.

The third embodiment has the same advantages as those in the second embodiment. In the third embodiment, the memory MEM that relieves the defect in units of segments reduces test time and test costs.

Figure 18:
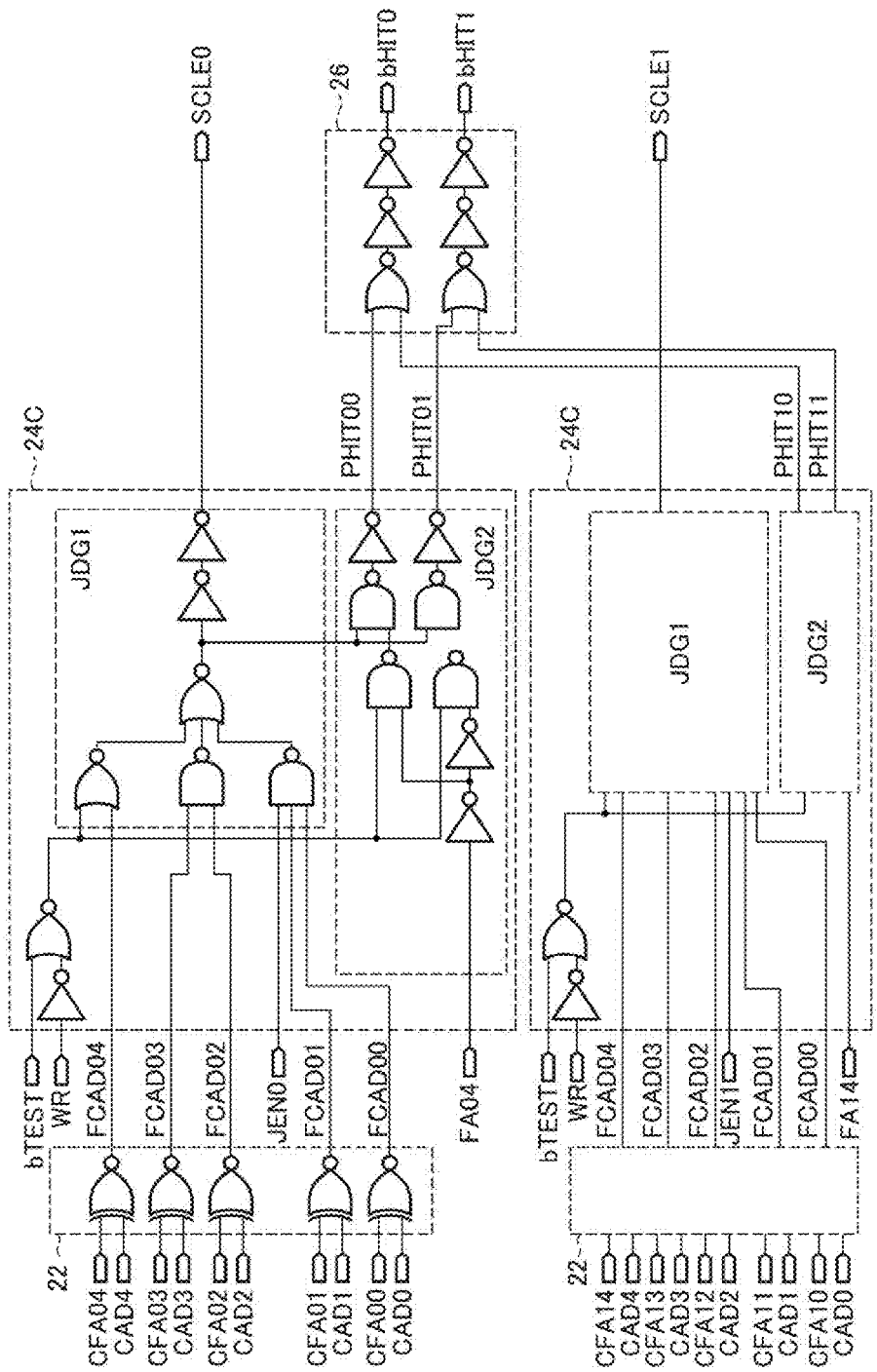
FIG. 18 illustrates a comparator circuit, a judgment circuit, and an OR circuit according to the third embodiment.

FIG. 18 illustrates a comparator circuit 22, a judgment circuit 24C, and an OR circuit 26 according to a fourth embodiment. In the fourth embodiment, the same elements as in the foregoing third embodiment are attached with the same symbols and reference numerals to reduce or omit the description. The fourth embodiment includes a judgment circuit 24C instead of the judgment circuit 24 in FIG. 5. Other structures in the fourth embodiment are the same as or similar to structures in FIGS. 1 to 5. Operations of the fourth embodiment in a normal operation mode are the same as those in FIGS. 8 and 9.

Only when a first judgment circuit JDG1 in the judgment circuit 24C receives a write command WR in a compression test mode, the first judgment circuit JDG1 masks a logic of a coincidence address signal FCAD04 (or FCAD14) and activates redundancy column enable signal SCLE0 (or SCLE1), in response to the coincidence address signals FCAD00 to FCAD03 (or FCAD11 to FCAD13). Only when a judgment circuit JDG2 in the judgment circuit 24C receives the write command WR in the compression test mode, the judgment circuit JDG2 activates any of hit signals PHIT00 and PHIT01 (or PHIT10 and PHIT11), in response to the coincidence address signals FCAD00 to FCAD03 (or FCAD11 to FCAD13) and a fuse address signal FA04 (or FA14).

Figure 19:
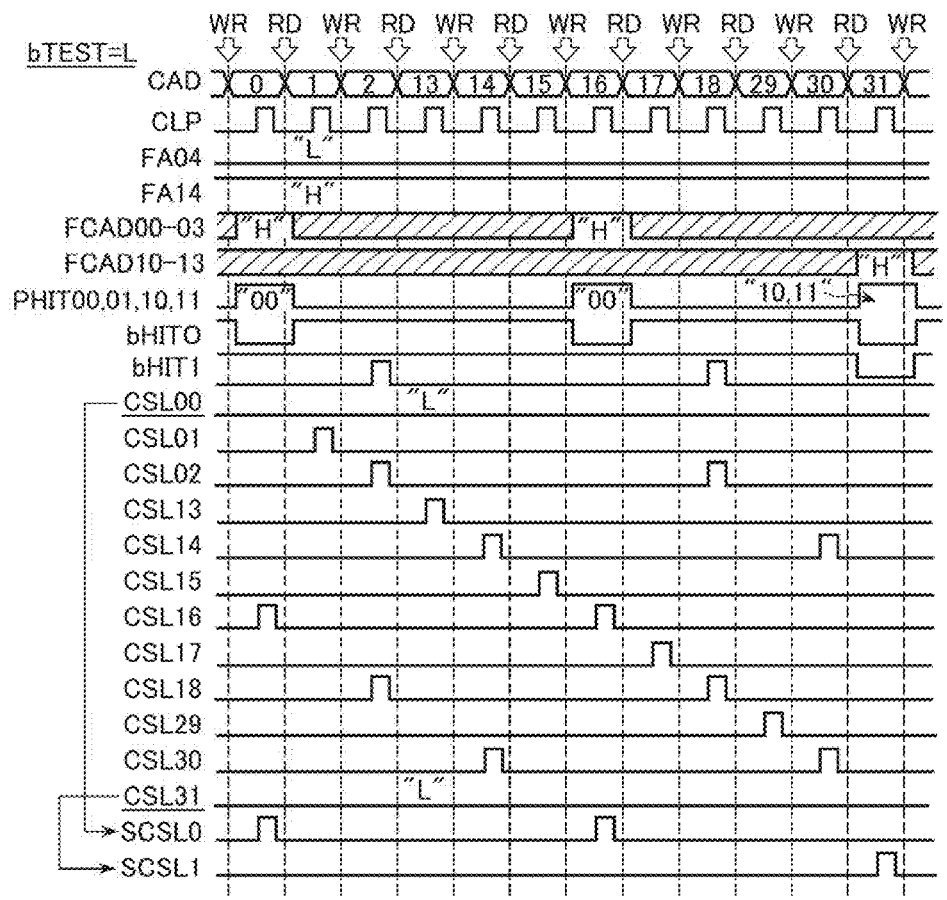
FIG. 19 illustrates a fourth embodiment.

FIG. 19 illustrates operations, in the compression test mode, of the semiconductor memory MEM according to the fourth embodiment. In an actual compression test mode, after the plurality of write commands WR are supplied to the memory MEM in order to write test data to a memory cell MC or a redundancy memory cell RMC, a plurality of read commands RD are supplied to the memory MEM in order to read the data from the memory cell MC or redundancy memory cell RMC. To simplify description, operations when the write commands WR and the read commands RD are alternately supplied (corresponding to FIG. 10) are illustrated in FIG. 19. The column address signals CAD0 to CAD4 supplied along with an access command and defective addresses FA00 to FA04 and FA10 to FA14, which are stored in a pair of fuse circuit groups FS0 to FS4 corresponding to redundancy column selection lines SCSL0 and SCSL1 in FIG. 19, are the same as the address signals illustrated in FIG. 10.

A write operation in response to the write command WR of the compression test according to the fourth embodiment is the same as that illustrated in FIG. 10.

A read operation in response to the read command RD is the same as that illustrated in FIG. 8. That is to say, in the fourth embodiment, a selection of both the redundancy column selection line SCSL (one of SCSL0 and SCSL1) and a column selection line CSL (any one of CSL00 to CSL31) are carried out only in the write operation.

In the read operation, when both of the column selection lines CSL00 to CSL31 and the redundancy column selection lines SCSL0 and SCSL1 are activated contemporaneously, it is preferable that parallel read data be output from a data terminal DQ in sequence to prevent a collision of data read out from the memory cell MC. For the above reason, a circuit especially used for storing the read data or a dedicated read circuit is desired. In the fourth embodiment, it is unnecessary to provide a dedicated circuit because the column address signals CAD0 to CAD4 only are compressed in the write operation in the compression test mode.

The fourth embodiment has the same advantages as those in the third embodiment. In the fourth embodiment, it is unnecessary to provide the dedicated circuit for outputting the parallel read data in sequence to the data terminal DQ. Thus, test time and test costs may be reduced.

That is to say, the fourth embodiment may reduce the test time and the test costs, while reducing chip size of the memory MEM.

In the embodiments, a fast cycle RAM (FCRAM) of pseudo SRAM type is applicable. However, in the fourth embodiment, a fast cycle RAM, a dynamic RAM (DRAM), a static RAM (SRAM) of synchronous DRAM (SDRAM) type or a ferro-electric random access memory may be applied. In the embodiments, a semiconductor memory can be applied in which memory cells are relieved by a given bit unit, that is to say, in units of a given number of bit lines BL and/BL coupled to column selection lines CSL.

In the embodiments, a memory MEM including a pair of row blocks RBLK0 and RBLK1 is applicable. However, for example, in the embodiments, another memory MEM including two or more pairs of row blocks RBLK may be applied. In addition, in the embodiments, it is possible that the column selection line CSL may be replaced by the redundancy column selection line SCSL with respect to each pair of row blocks.

In the third embodiment, the memory MEM may include a logic circuit R1 which is the same as that in FIG. 2.

Example embodiments of the present invention have now been disclosed in accordance with the above advantages. It will be appreciated that these examples are merely illustrative of the invention. Many variations and modifications will be apparent to those skilled in the art.

The invention claimed is:

1. A semiconductor memory which performs a redundancy on a memory cell by a given bit unit, the semiconductor memory comprising:
    a comparator circuit that compares an input address and a redundancy address; and
    a judgment circuit that judges whether to perform the redundancy based on a compared result,
    wherein the judgment circuit outputs a plurality of redundancy judgment signals that indicate whether to perform the redundancy for each portion obtained by dividing the given bit unit by n which is an integer equal to or greater than two.

2. The semiconductor memory according to claim 1, wherein the judgment circuit outputs the plurality of redundancy judgment signals based on a test mode signal.

3. The semiconductor memory according to claim 1, wherein the judgment circuit outputs the plurality of redundancy judgment signals based on a given bit in the input address.

4. The semiconductor memory according to claim 1, further comprising:
    a redundancy address circuit that stores the redundancy address, wherein whether to perform the redundancy on the divided portion is judged based on a signal from the redundancy address circuit.

5. The semiconductor memory according to claim 1, wherein the judgment circuit outputs a signal that activates a redundancy column line.

6. The semiconductor memory according to claim 1, wherein the judgment circuit includes:
    a first circuit that judges whether to perform the redundancy based on a given bit in the input address; and a second circuit, provided corresponding to the divided portion, which outputs the redundancy judgment signal based on a judged result by the first circuit and the redundancy address.

7. The semiconductor memory according to claim 1, further comprising:
   a first storing circuit that stores a first redundancy address;
   a first judgment circuit that judges whether to perform the redundancy based on the first redundancy address and outputs a plurality of first redundancy judgment signals corresponding to a first divided portion and a second divided portion;
   a second storing circuit that stores a second redundancy address; and
   a second judgment circuit that judges whether to perform the redundancy based on the second redundancy address and outputs a plurality of second redundancy judgment signals corresponding to the first divided portion and the second divided portion.

8. The semiconductor memory according to claim 7, further comprising:
   a first logical operation circuit that performs a logical operation on the plurality of first redundancy judgment signals; and
   a second logical operation circuit that performs a logical operation on the plurality of second redundancy judgment signals.

9. The semiconductor memory according to claim 1, further comprising:
   a pre-charge circuit that keeps a redundancy column line a constant potential.

10. A semiconductor memory which performs a redundancy on a memory cell by a given bit unit, wherein, based on a redundancy address, whether to perform the redundancy on a first portion in the given bit unit is judged, and whether to perform the redundancy on a second portion, which is different from the first portion, in the given bit unit is judged.

11. The semiconductor memory according to claim 10, wherein when the redundancy on the first portion is performed, a redundancy column line corresponding to the first portion is selected and a real column line corresponding to the second portion is selected.

12. The semiconductor memory according to claim 11, wherein the redundancy column line and the real column line are selected in a test mode.

13. The semiconductor memory according to claim 10, wherein when the redundancy on the first portion is performed in a normal mode, a column line corresponding to the second portion is not selected.

14. The semiconductor memory according to claim 11, wherein both the redundancy column line and the real column line are selected in a write operation.

15. The semiconductor memory according to claim 10, wherein a first redundancy judgment signal that indicates whether to perform the redundancy on the first portion is generated and a second redundancy judgment signal that indicates whether to perform the redundancy on the second portion is generated, based on an input address and the redundancy address.

16. A method of manufacturing a semiconductor memory, the method comprising:
   judging on whether to perform a redundancy on a memory cell by comparing an input address and a redundancy address; and
   when judging to perform the redundancy on the memory cell, based on the redundancy address, selecting a redundancy column line corresponding to a first bit group in a given bit unit in which the redundancy on the memory cell is performed, and selecting a real column line corresponding to a second bit group, which is different from the first bit group, in the given bit unit.

17. The method of manufacturing the semiconductor memory according to claim 16, wherein the redundancy column line is selected in a test mode.

18. The method of manufacturing the semiconductor memory according to claim 16, wherein both the redundancy column line and the real column line are selected in a write operation.

19. The method of manufacturing the semiconductor memory according to claim 16, wherein a test of the memory cell is performed by one of writing data to the memory cell, which is selected based on the redundancy column line and the real column line, and reading data from the memory cell.

20. The method of manufacturing the semiconductor memory according to claim 16, the method comprising:
   selecting one of a first redundancy column line corresponding to the first bit group and a second redundancy column line corresponding to the second bit group, based on the redundancy address;
   selecting a first real column line corresponding to the first bit group when not selecting the first redundancy column line; and
   selecting a second real column line corresponding to the second bit group when not selecting the second redundancy column line.

* * * * *